(12) United States Patent
Lee et al.

(10) Patent No.: US 7,617,433 B2
(45) Date of Patent: *Nov. 10, 2009

(54) IMPLEMENTATION OF LDPC (LOW DENSITY PARITY CHECK) DECODER BY SWEEPING THROUGH SUB-MATRICES

(75) Inventors: Tak K. Lee, Irvine, CA (US); Hau Thien Tran, Irvine, CA (US); Ba-Zhong Shen, Irvine, CA (US); Kelly Brian Cameron, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 662 days.

This patent is subject to a terminal disclaimer.

(21) Appl. No.: 11/360,268

(22) Filed: Feb. 23, 2006

(65) Prior Publication Data

US 2007/0157062 A1    Jul. 5, 2007

Related U.S. Application Data

(60) Provisional application No. 60/755,802, filed on Jan. 3, 2006.

(51) Int. Cl.
    *H03M 13/00* (2006.01)
(52) U.S. Cl. ..................... 714/752; 714/758
(58) Field of Classification Search ............. 714/752, 714/758
    See application file for complete search history.

(56) References Cited

U.S. PATENT DOCUMENTS 3,542,756 A    11/1970    Gallager
3,665,396 A    5/1972    Forney, Jr.
4,295,218 A    10/1981    Tanner
6,430,233 B1    8/2002    Dillon et al.
6,473,010 B1    10/2002    Vityaev et al.
6,567,465 B2    5/2003    Goldstein et al.
6,633,856 B2    10/2003    Richardson et al.
6,938,196 B2 *    8/2005    Richardson et al. ......... 714/752
6,957,375 B2 *    10/2005    Richardson ................. 714/752

(Continued)

OTHER PUBLICATIONS

R. G. Gallager, "Low density parity check codes," IRE Trans. Info. Theory, vol. IT-8, pp. 21-28, Jan. 1962.

(Continued)

*Primary Examiner*—M. Mujtaba K Chaudry
(74) *Attorney, Agent, or Firm*—Garlick Harrison & Markison; Shayne X. Short

(57) ABSTRACT

Implementation of LDPC (Low Density Parity Check) decoder by sweeping through sub-matrices. A novel approach is presented by which an LDPC coded signal is decoded processing the columns and rows of the individual sub-matrices of the low density parity check matrix corresponding to the LDPC code. The low density parity check matrix can partitioned into rows and columns according to each of the sub-matrices of it, and each of those sub-matrices also includes corresponding rows and columns. For example, when performing bit node processing, the same columns of at 1 or more sub-matrices can be processed together (e.g., all $1^{st}$ columns in 1 or more sub-matrices, all $2^{nd}$ columns in 1 or more sub-matrices, etc.). Analogously, when performing check node processing, the same rows of 1 or more sub-matrices can be processed together (e.g., all $1^{st}$ rows in 1 or more sub-matrices, all $2^{nd}$ rows in 1 or more sub-matrices, etc.).

20 Claims, 24 Drawing Sheets

U.S. PATENT DOCUMENTS

| | | | |
|---|---|---|---|
| 7,246,304 B2 * | 7/2007 | Kim | 714/801 |
| 7,299,397 B2 * | 11/2007 | Yokokawa et al. | 714/752 |
| 7,401,283 B2 * | 7/2008 | Shen et al. | 714/758 |
| 7,415,079 B2 * | 8/2008 | Cameron et al. | 375/340 |
| 7,454,685 B2 * | 11/2008 | Kim et al. | 714/758 |
| 2003/0104788 A1 | 6/2003 | Kim | |
| 2005/0149844 A1 * | 7/2005 | Tran et al. | 714/800 |
| 2005/0262420 A1 * | 11/2005 | Park et al. | 714/758 |
| 2006/0107179 A1 * | 5/2006 | Shen et al. | 714/758 |
| 2006/0274772 A1 * | 12/2006 | Kim et al. | 370/412 |

OTHER PUBLICATIONS

R. Gallager, Low-Density Parity-Check Codes, Cambridge, MA: MIT Press, 1963, 90 pages.

M. Luby, M. Mitzenmacher, M. A. Shokrollahi, D. A. Spielman, and V. Stemann, "Practical Loss-Resilient Codes", Proc. 29th Symp. on Theory of Computing, 1997, pp. 150-159.

T. J. Richardson and R. L. Urbanke, "The capacity of low-density parity-check code under message-passing decoding," IEEE Trans. Inform. Theory, vol. 47, No. 2, pp. 599-618, Feb. 2001.

* cited by examiner

IMPLEMENTATION OF LDPC (LOW DENSITY PARITY CHECK) DECODER BY SWEEPING THROUGH SUB-MATRICES

CROSS REFERENCE TO RELATED PATENTS/PATENT APPLICATIONS

Provisional Priority Claims

The present U.S. Utility patent Application claims priority pursuant to 35 U.S.C. § 119(e) to the following U.S. Provisional Patent Application which is hereby incorporated herein by reference in its entirety and made part of the present U.S. Utility patent Application for all purposes:

1. U.S. Provisional Application Ser. No. 60/755,802, entitled "Implementation of LDPC (Low Density Parity Check) decoder by sweeping through sub-matrices," filed Tuesday, Jan. 3, 2006.

BACKGROUND OF THE INVENTION

1. Technical Field of the Invention

The invention relates generally to communication systems; and, more particularly, it relates to decoding signals employed within such communication systems.

2. Description of Related Art

Data communication systems have been under continual development for many years. One such type of communication system that has been of significant interest lately is a communication system that employs iterative error correction codes. Of particular interest is a communication system that employs LDPC (Low Density Parity Check) code. Communications systems with iterative codes are often able to achieve lower BER (Bit Error Rate) than alternative codes for a given SNR (Signal to Noise Ratio).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code of a length of one million, it nevertheless demonstrates the very promising application of LDPC codes within communication systems.

The use of LDPC coded signals continues to be explored within many newer application areas. Some examples of possible communication systems that may employ LDPC coded signals include communication systems employing 4 wire twisted pair cables for high speed Ethernet applications (e.g., 10 Gbps (Giga-bits per second) Ethernet operation according to the IEEE 802.3an (10GBASE-T) emerging standard) as well as communication systems operating within a wireless context (e.g., in the IEEE 802.11 context space including the IEEE 802.11n emerging standard).

For any of these particular communication system application areas, near-capacity achieving error correction codes are very desirable. The latency constraints, which would be involved by using traditional concatenated codes, simply preclude their use in such applications in very high data rate communication system application areas.

When performing decoding processing of such LDPC signals within communication systems, a designer has quite a degree of freedom by which to implement the hardware to perform such decoding. By selecting a particular topological arrangement (in terms of hardware and processing resources) for implementing an LDPC code decoder. Depending on the particular design parameters desired to be optimized, a designer can select a particular decoder design to meet any one or more of various design objectives including meeting desired levels of area, time, and power that are required to decode such LDPC signals effectively and to an acceptable degree of performance for a given application. There seems continual to be a need in the art for more and better designs to allow a hardware device designer to select a particular arrangement to meet the particular needs of a particular application.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Figure 1:
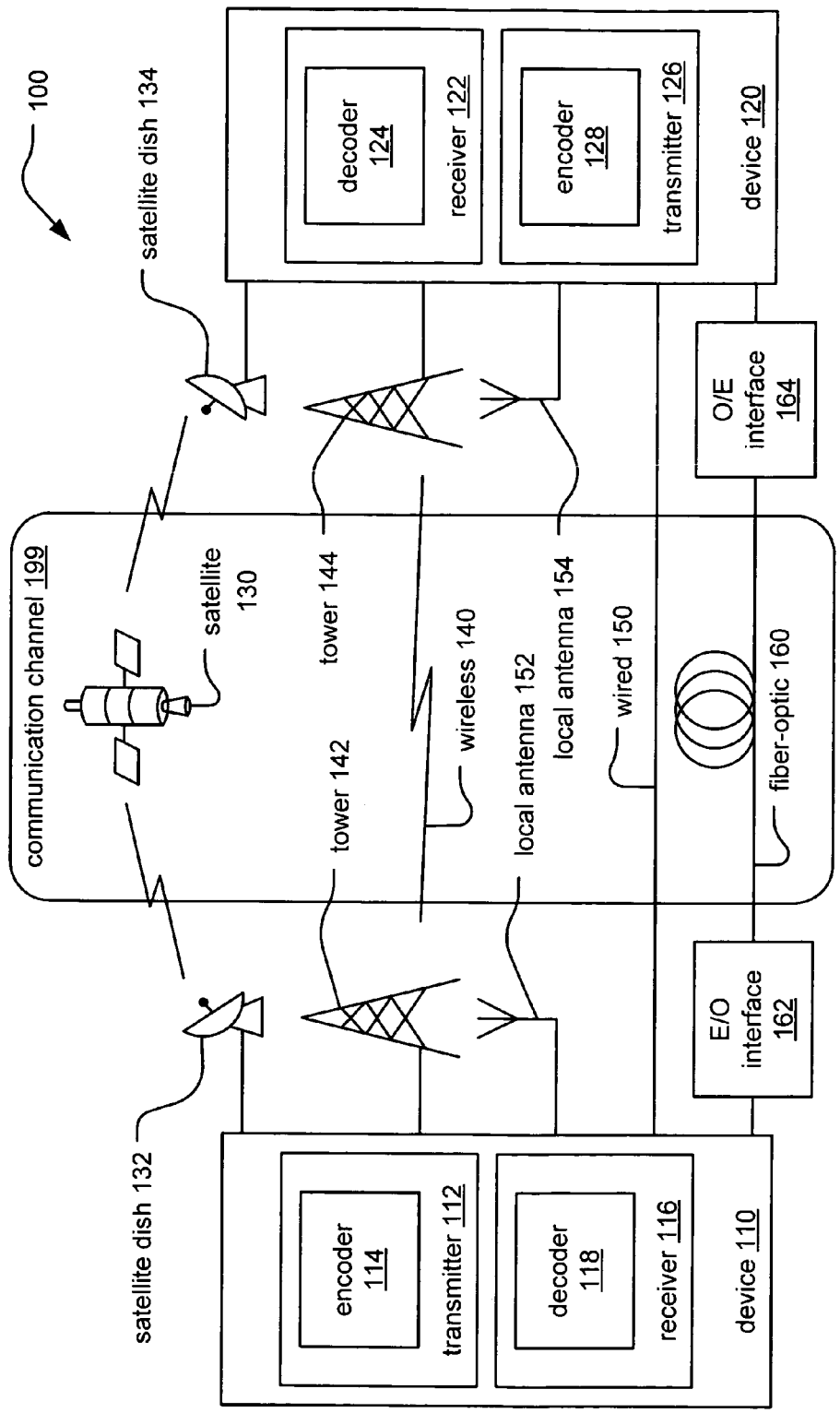
FIG. 1 and FIG. 2 illustrate various embodiments of communication systems.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wireless, fiber, copper, and other types of media as well.

Figure 2:
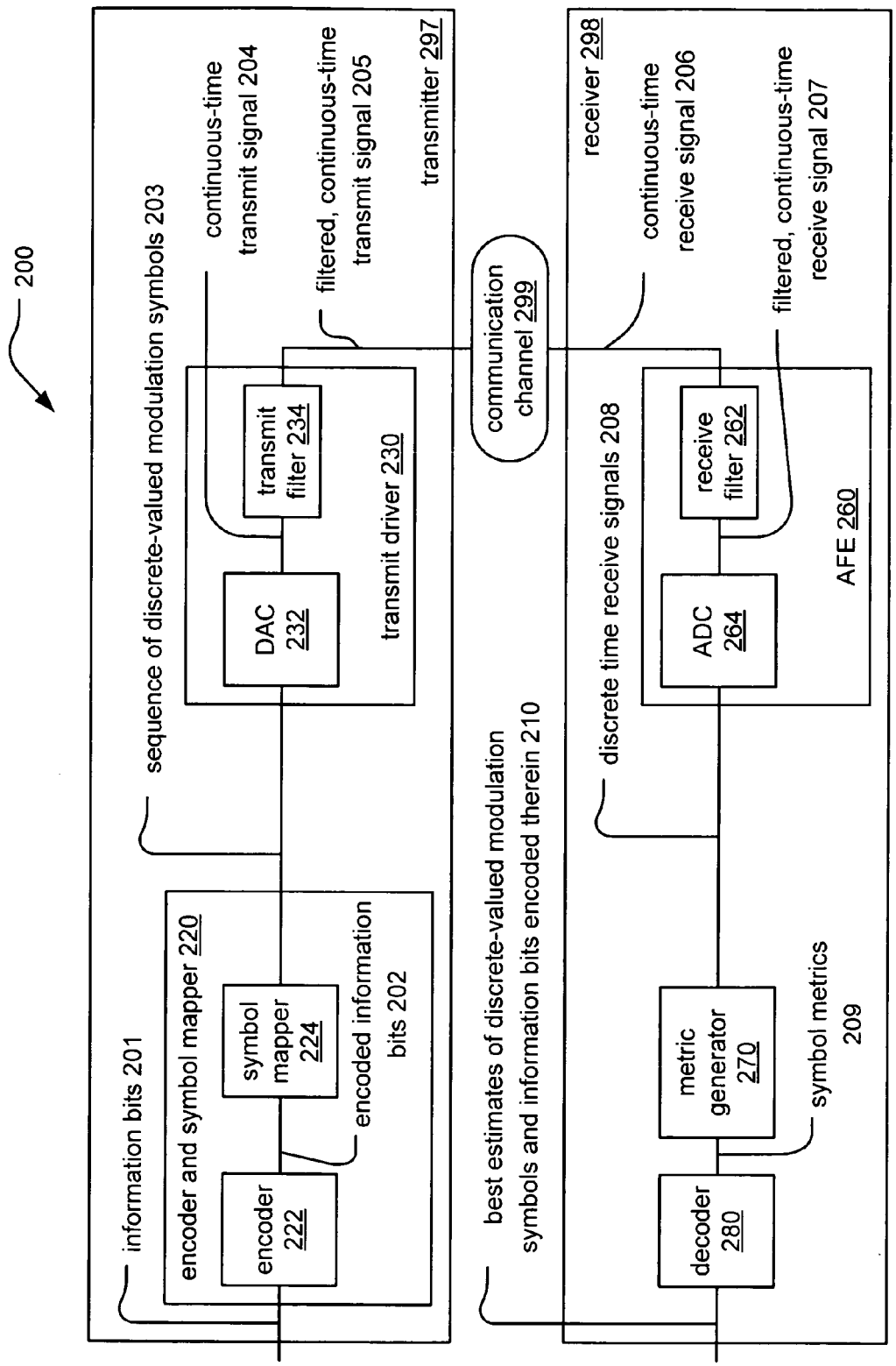

FIG. 1 and FIG. 2 are diagrams illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 tat is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates symbol metrics 209 that are employed by a decoder 280 to make best estimates of the discrete-valued modulation symbols and information bits encoded therein 210.

The decoders of either of the previous embodiments may be implemented to include various aspects and/or embodiment of the invention therein. In addition, several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is an LDPC coded signal. Before more details are provided below, a general description of LDPC codes is provided.

Several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is an LDPC coded signals. Before more details are provided below, a general description of LDPC codes is provided.

Figure 3:
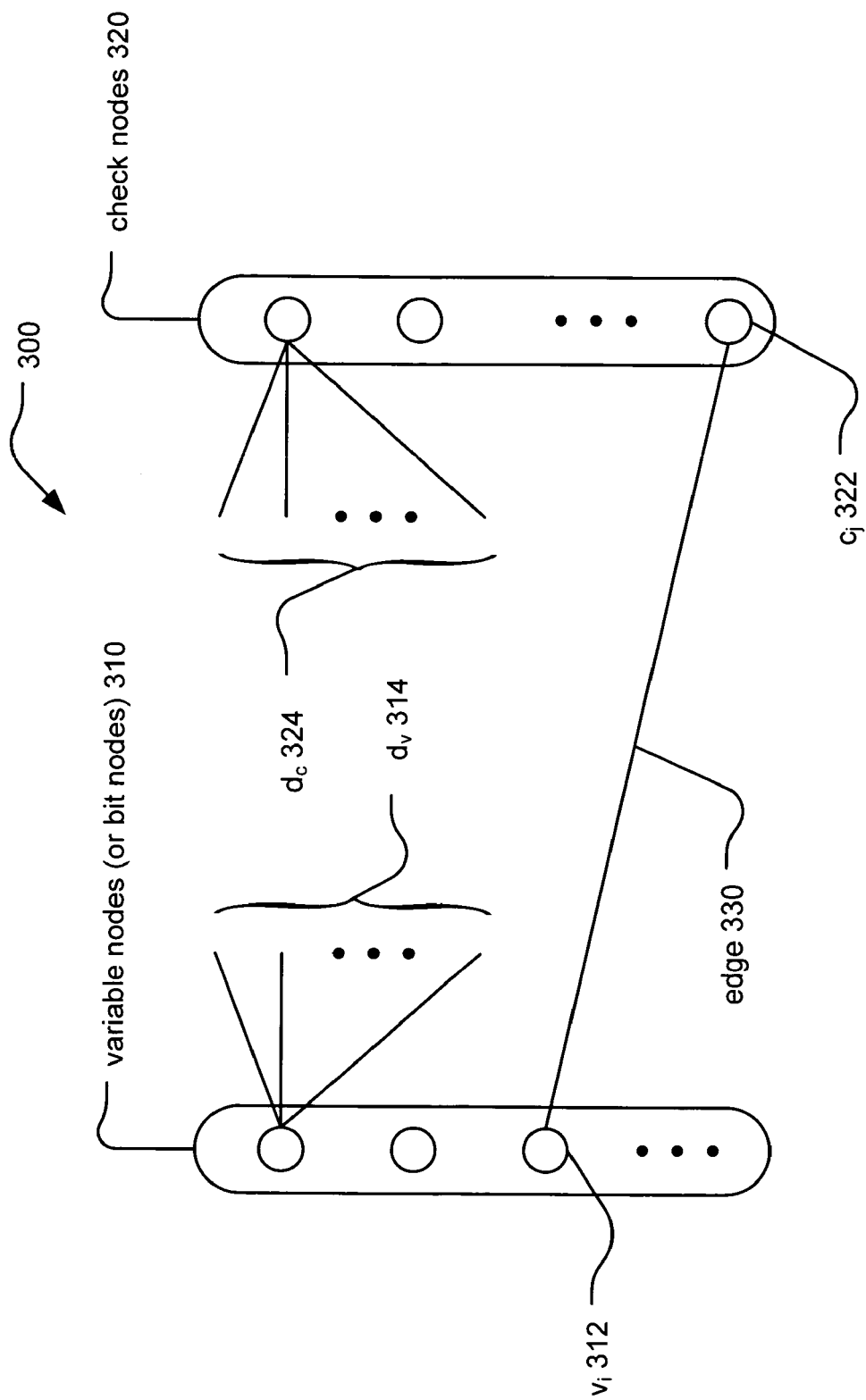
FIG. 3 illustrates an embodiment of an LDPC (Low Density Parity Check) code bipartite graph.

FIG. 3 illustrates an embodiment of an LDPC (Low Density Parity Check) code bipartite graph 300. In the art, an LDPC bipartite graph may also sometimes be referred to as a Tanner graph. An LDPC code may be viewed as being a code having a binary parity check matrix such that nearly all of the elements of the matrix have values of zeroes (e.g., the binary parity check matrix is sparse). For example, $H=(h_{i,j})_{M \times N}$ may be viewed as being a parity check matrix of an LDPC code with block length N.

The number of 1's in the i-th column of the parity check matrix may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v,d_c)$ regular LDPC code, otherwise the LDPC code is called an irregular LDPC code.

LDPC codes were introduced by R. Gallager in [1] referenced below and by M. Luby et al. in [2] also referenced below.

[1] R. Gallager, *Low-Density Parity-Check Codes*, Cambridge, Mass.: MIT Press, 1963.

[2] M. G. Luby, M. Mitzenmacher, M. A. Shokrollahi, D. A. Spielman, and V. Stemann, "Practical Loss-Resilient Codes", *Proc. 29th Symp. on Theory of Computing*, 1997, pp. 150-159.

A regular LDPC code can be represented as a bipartite graph 300 by its parity check matrix with left side nodes representing variable of the code bits (or alternatively as the "variable nodes" (or "bit nodes") 310 in a bit decoding approach to decoding LDPC coded signals), and the right side nodes representing check equations (or alternatively as the "check nodes" 320). The bipartite graph 300 of the LDPC code defined by H may be defined by N variable nodes (e.g., N bit nodes) and M check nodes. Every variable node of the N variable nodes 310 has exactly $d_v(i)$ edges (an example edge shown using reference numeral 330) connecting the bit node, $v_i$ 312, to one or more of the check nodes (within the M check nodes). The edge 310 is specifically shown as connecting from the bit node, $v_i$ 312, to the check node, $c_j$ 322. This number of $d_v$ edges (shown as $d_v$ 314) may be referred to as the degree of a variable node i. Analogously, every check node of the M check nodes 1520 has exactly $d_c(j)$ edges (shown as $d_c$ 324) connecting this node to one or more of the variable nodes (or bit nodes) 310. This number of edges, $d_c$, may be referred to as the degree of the check node j.

An edge 330 between a variable node $v_i$ (or bit node $b_i$) 312 and check node $c_j$ 322 may be defined by $e=(i,j)$. However, on the other hand, given an edge $e=(i,j)$, the nodes of the edge may alternatively be denoted as by $e=(v(e),c(e))$ (or $e=(b(e),c(e))$). Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$). Given a check node $c_j$, one may define the set of edges emitting from the node $c_j$ by $E_c(j)=\{e|c(e)=j\}$. Continuing on, the derivative result will be $|E_v(i)|=d_v$ (or $|E_b(i)|=d_b$) and $|E_c(j)|=d_c$.

Generally speaking, any codes that can be represented by a bipartite graph may be characterized as graph codes. It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$ of an irregular LDPC code, $|E_v(i_1)|$ may not equal to $|E_v(i_2)|$. This relationship may also hold true for two check nodes. The concept of irregular LDPC codes was originally introduced within M. Luby et al. in [2] referenced above.

In general, with a graph of an LDPC code, the parameters of an LDPC code can be defined by a degree of distribution, as described within M. Luby et al. in [2] referenced above and also within the following reference [3]:

[3] T. J. Richardson and R. L. Urbanke, "The capacity of low-density parity-check code under message-passing decoding," *IEEE Trans. Inform. Theory*, Vol. 47, pp. 599-618, February 2001.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda,\rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that certain aspects and/or embodiments of the invention are also operable to accommodate both regular LDPC codes and irregular LDPC.

Figure 4:
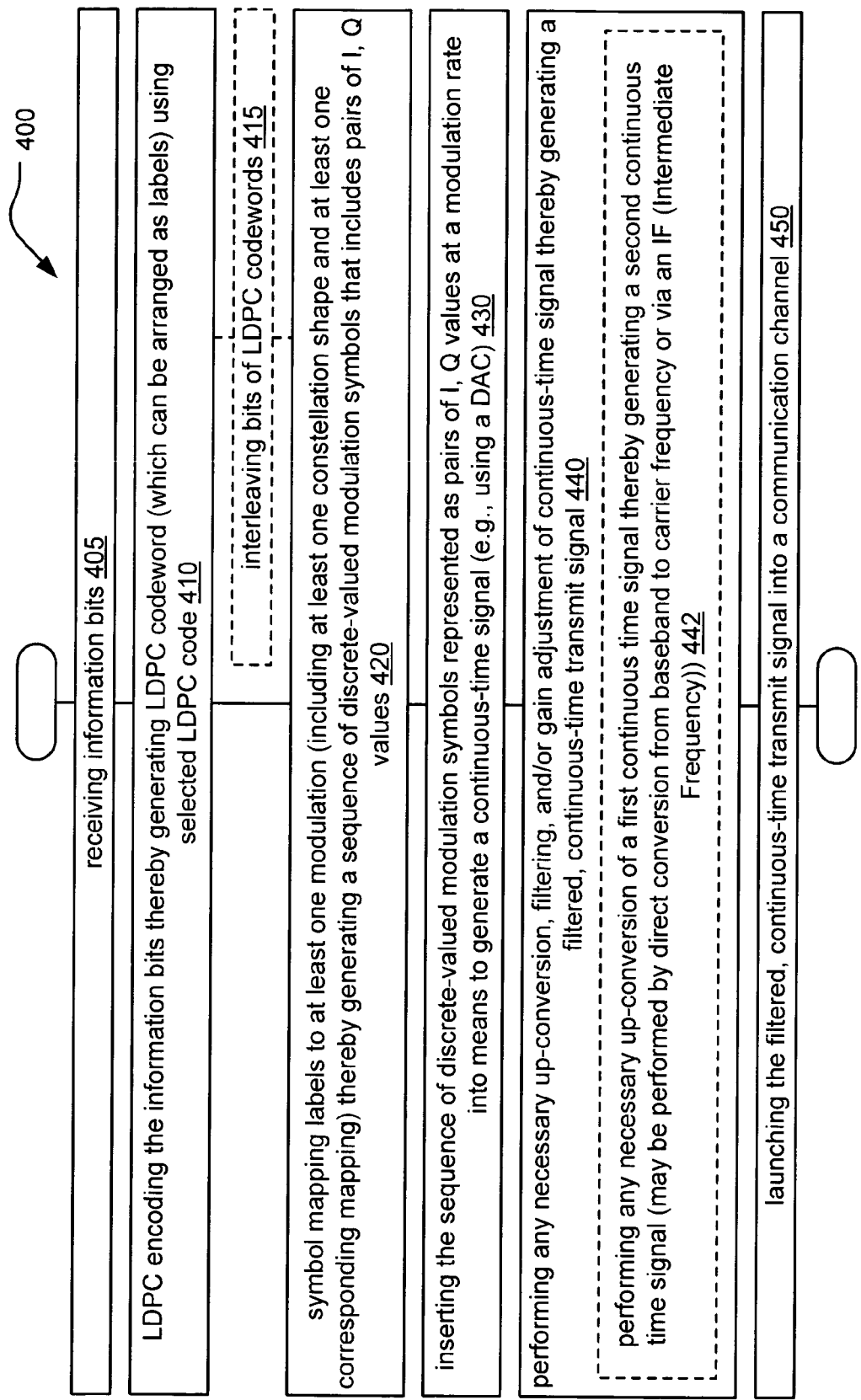
FIG. 4 illustrates an embodiment of a method for transmit processing of an LDPC coded signal.

FIG. 4 illustrates an embodiment of a method 400 for transmit processing of an LDPC coded signal. The method 400 that may be viewed as being performed at a transmitter end of a communication channel.

This method 400 also may be viewed as involving the generation of an LDPC coded signal as well as any operations to that are required to comport the LDPC coded signal to a communication channel into which a corresponding continuous-time transmit signal is to be launched.

Initially, this method 400 involves receiving information bits, as shown in a block 405. These information bits correspond to the actual information that is desired to be transmitted from one end of a communication channel to the other. At the other end, an effort to making best estimates of these original information bits is made. Continuing on, this method 400 involves LDPC encoding the information bits thereby generating an LDPC codeword (which can be arranged as labels), as shown in a block 410. For example, the LDPC codeword (or LDPC block) can be arranged to include labels that all have the same number of bits or labels of different bit sizes. This encoding may be performed using a selected LDPC code. In some instances, the method 400 may also involve interleaving the bits of a LDPC codeword after encoding them using an LDPC code, as shown in a block 415.

Then, as shown in a block 420, the method 400 then continues by symbol mapping the labels to at least one modulation (that includes at least one constellation shape and at least one corresponding mapping). In some embodiments, these labels are symbol mapped to a number of different modulation types thereby generating a variable modulation and/or code rate signal whose modulation and/or code rate may vary as frequently as on a frame by frame basis or even as frequently as on a symbol by symbol basis. This symbol mapping of the labels to at least one modulation thereby generates a sequence of discrete-valued modulation symbols that includes pairs of I, Q values (or higher dimensional constellation). At this point, the sequence of discrete-valued modulation symbols may be viewed as being an LDPC coded modulation signal (being in completely digital form at this point).

The method 400 then involves inserting each symbol of the sequence of discrete-valued modulation symbols represented as pairs of I, Q values (or higher order constellation values) at a modulation rate into means to generate a continuous-time signal, as shown in a block 430. For example, this may be performed using a DAC (Digital to Analog Converter).

Afterwards, once this continuous-time signal (typically at a baseband frequency) is output from the DAC or substantially equivalent means, the method 400 may involve performing any necessary up-conversion, filtering, and/or gain adjustment of the continuous-time signal (e.g., the continuous-time baseband signal) thereby generating a filtered, continuous-time transmit signal, as shown in a block 440. There may be some instances where no up-conversion, filtering, and/or gain adjustment needs to be made, and the continuous-time signal output from a DAC or equivalent means is already in a format that comports to a communication channel (or media) into which it is to be launched (or stored). After any of the appropriate processing is performed to transform the signal into a form that comports to the communication channel (or media), it is launched therein, as shown in a block 450.

The following diagram shows a method 500 that may be viewed as being performed at a receiver end of a communication channel. This received continuous-time signal may be viewed, in some embodiments, as being communication channel modified continuous-time transmit signal that had been launched into a communication channel at a transmitter end. Typically, a communication channel modifies (oftentimes undesirably) a continuous-time transmit signal that has been launched into and transmitted through it (or stored on it). The diagram illustrated and described below shows the method 500 by which the receive processing of such a received continuous-time signal (e.g., at a receiver end of a communication channel) may be performed in an effort ultimately to make best estimates of the information bits that had been encoded therein.

Figure 5:
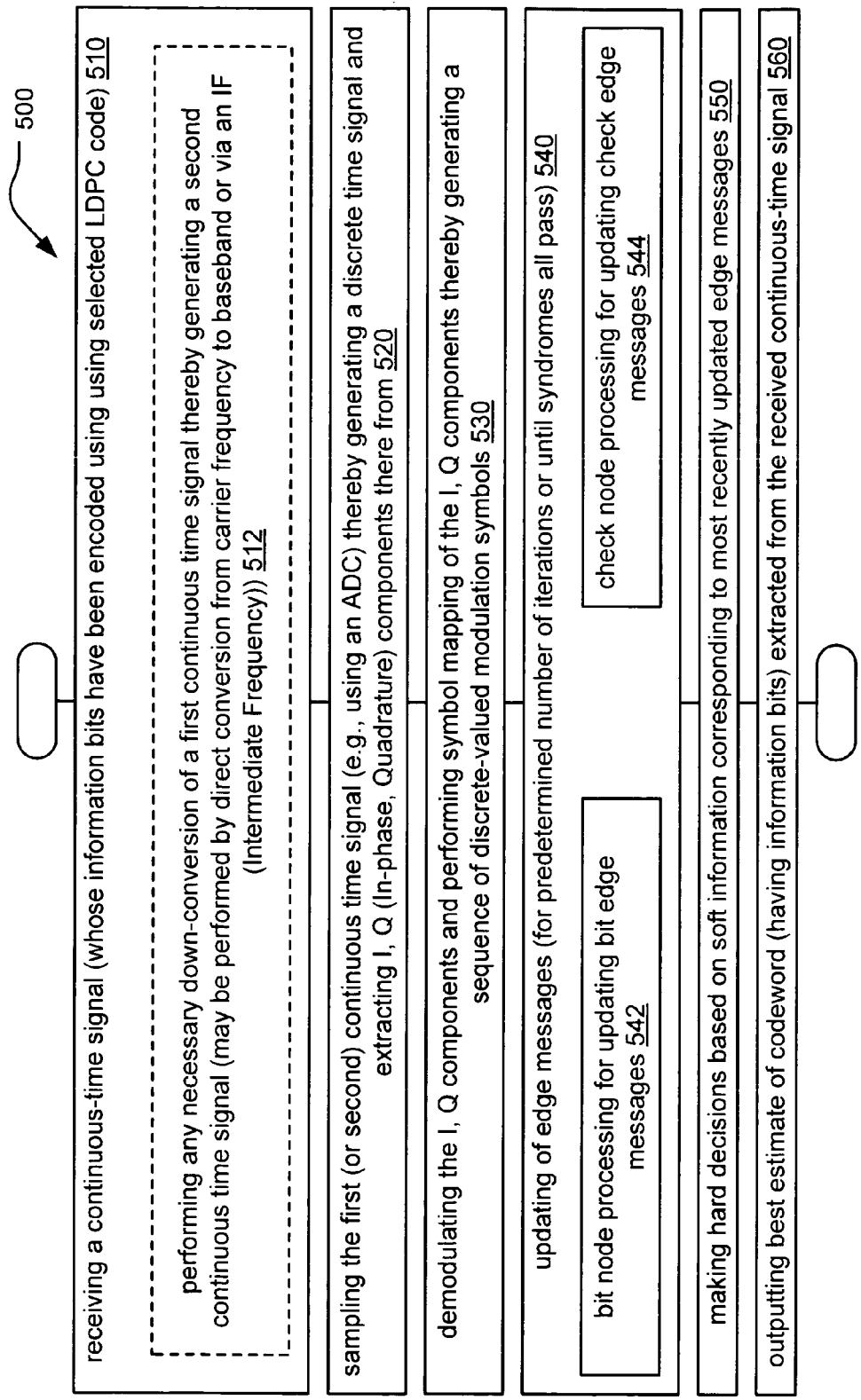
FIG. 5 illustrates an embodiment of a method for receive processing of an LDPC coded signal.

FIG. 5 illustrates an embodiment of a method 500 for receive processing of an LDPC coded signal. The method 500 initially involves receiving a continuous-time signal, as shown in a block 510. This receiving and processing of the continuous-time signal may also involve performing any necessary down-conversion of a first continuous-time signal thereby generating a second continuous-time signal, as shown in a block 512. Any frequency conversion that may need to be performed may possibly be performed by direct conversion from carrier frequency to a baseband frequency. This frequency conversion may alternatively be performed via an IF (Intermediate Frequency). In whichever embodiment, the received continuous-time signal is typically brought down in frequency to a baseband continuous-time signal when performing this method 500.

The method 500 also involves sampling the first (or second) continuous-time signal thereby generating a discrete time signal and extracting I, Q (In-phase, Quadrature) components there from, as shown in a block 520. This sampling may be performed using an ADC (Analog to Digital Converter) or equivalent means to generate the discrete time signal from the appropriately down-converted (and potentially also filtered) received continuous-time signal. The I, Q components of the individual samples of the discrete time signal are also extracted within this step. The method 500 then involves demodulating the I, Q components and performing symbol mapping of the I, Q components thereby generating a sequence of discrete-valued modulation symbols, as shown in a block 530.

The next step of the method 500 of this embodiment involves performing updating of edge messages for a predetermined number of iterations, as shown in a block 540. This step may be viewed as performing the LDPC decoding in accordance with any of the various embodiments described above. This LDPC decoding generally involves bit node processing for updating bit edge messages (as shown in a block 542) as well as check node processing for updating check edge messages (as shown in a block 544).

After the final decoding iteration of the predetermined number of decoding iterations (or until all syndromes of the LDPC code are equal to zero (i.e., all syndromes pass) in an alternative embodiment), the method 500 involves making hard decisions based on soft information corresponding to most recently updated edge messages with respect to the bit nodes, as shown in a block 550. The method 500 ultimately involves outputting a best estimate of the codeword (that includes the information bits) that has been extracted from the received continuous-time signal, as shown in a block 560.

Figure 6:
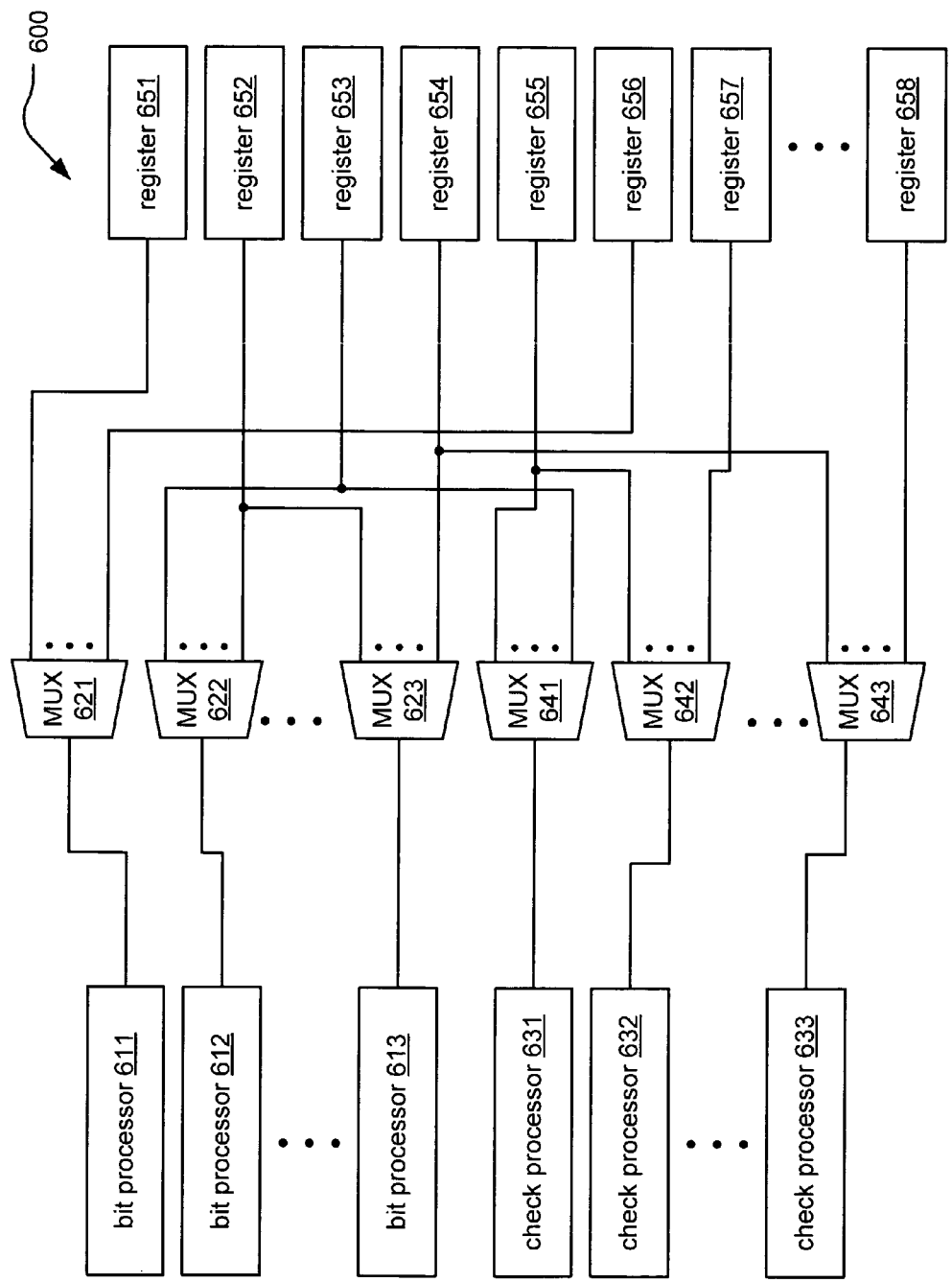
FIG. 6 illustrates an embodiment of a plurality of registers multiplexed among a plurality of bit processors and check processors.

FIG. 6 illustrates an embodiment 600 of a plurality of registers multiplexed among a plurality of bit processors and check processors. In previous designs which implement the decoding in a totally parallel setup, the number of bit nodes of the LDPC code (e.g., which can be extracted from the LDPC bipartite graph) determines the number of bit processors to be employed on a 1 to 1 basis. Similarly, in a totally parallel setup, the number of check nodes of the LDPC code (e.g., which can be extracted from the LDPC bipartite graph) determines the number of check processors to be employed on a 1 to 1 basis. Each of the bit node processing and the check node processing is therefore performed in 1 cycle each. During bit node processing, each bit processor communicates with its corresponding group of registers. During check node processing, each check processor communicates with its corresponding group of registers.

In such a totally parallel setup, the totally number of bit processor and check processors can be very large. In some designs, this large consumption of space and processing resources in a device is undesirable and/or extremely expensive in terms of cost and/or real estate consumption.

In contradistinction, the embodiment 600 shows how a reduced number of both bit processors and check processors can be employed to reduce significantly the amount of real estate to be consumed with these processing resources. A plurality of multiplexors (MUXes) is employed selectively to communicatively couple each of a plurality of bit processors (or a subset thereof) or a plurality of check processors (or a subset thereof) to a plurality of registers that is employed to perform management of the edge messages (i.e., bit edge messages and check edge messages) that are updated and employed when performing iterative decoding of an LDPC coded signal.

With reference to FIG. 6, a plurality of bit processors is shown as bit processor 611, bit processor 612, . . . , and bit processor 613. Each bit processor is communicatively coupled to a MUX that allows the selective communicative coupling to one or more of a plurality of registers (shown as register 651, register 652, register 653, register 654, register 655, register 656, register 657, . . . , register 659). Looking at some specific examples, the bit processor 611 communicatively couples to MUX 621 which allows for selective communicative coupling to at least register 651 and 656, as well as any other registers as desired in the particular implementation.

The bit processor 612 communicatively couples to MUX 622 which allows for selective communicative coupling to at least register 653 and 653, as well as any other registers as desired in the particular implementation. The bit processor 613 communicatively couples to MUX 623 which allows for selective communicative coupling to at least register 652 and 654, as well as any other registers as desired in the particular implementation.

The check processor 631 communicatively couples to MUX 641 which allows for selective communicative coupling to at least register 655 and 653, as well as any other registers as desired in the particular implementation. The check processor 632 communicatively couples to MUX 642 which allows for selective communicative coupling to at least register 655 and 657, as well as any other registers as desired in the particular implementation. The check processor 633 communicatively couples to MUX 643 which allows for selective communicative coupling to at least register 654 and 658, as well as any other registers as desired in the particular implementation.

Clearly, the number of each of bit processors, check processors, MUXes, and registers can be selected as desired for a particular application. When selecting the numbers and arrangement of such resources, a designer is provided the ability to make trade offs within a design. For example, when a fewer number of processors is employed (for each of bit processors and check processors), then a larger number of cycles needs to be performed when performing either bit node processing or check node processing. The fewer number of processors employed will reduce the amount of real estate consumed within the device and can provide for a lower cost, but the processing time will take longer by requiring more cycles for each of bit node processing and check node processing. Also, the memory management and connectivity required to connect bit processors, check processors, MUXes, and registers within an actual device should be considered, as this also consumes a certain degree of real estate and incurs a certain complexity and cost.

However, this design approach can be customized to a given application relatively easily by a designer. A designer can find the "sweet spot" in terms of selecting the appropriate amount of each of these resources (bit processors, check processors, MUXes, and registers) to meet his design objectives. For some designs, a reduced processing time is paramount and could lead to a semi-parallel design approach for each of the bit node processing and check node processing. Alternatively, in other designs, a reduced real estate (and/or reduced cost) is paramount, and a relatively fewer number of each of the bit processors and check processors is desirable.

Figure 7:
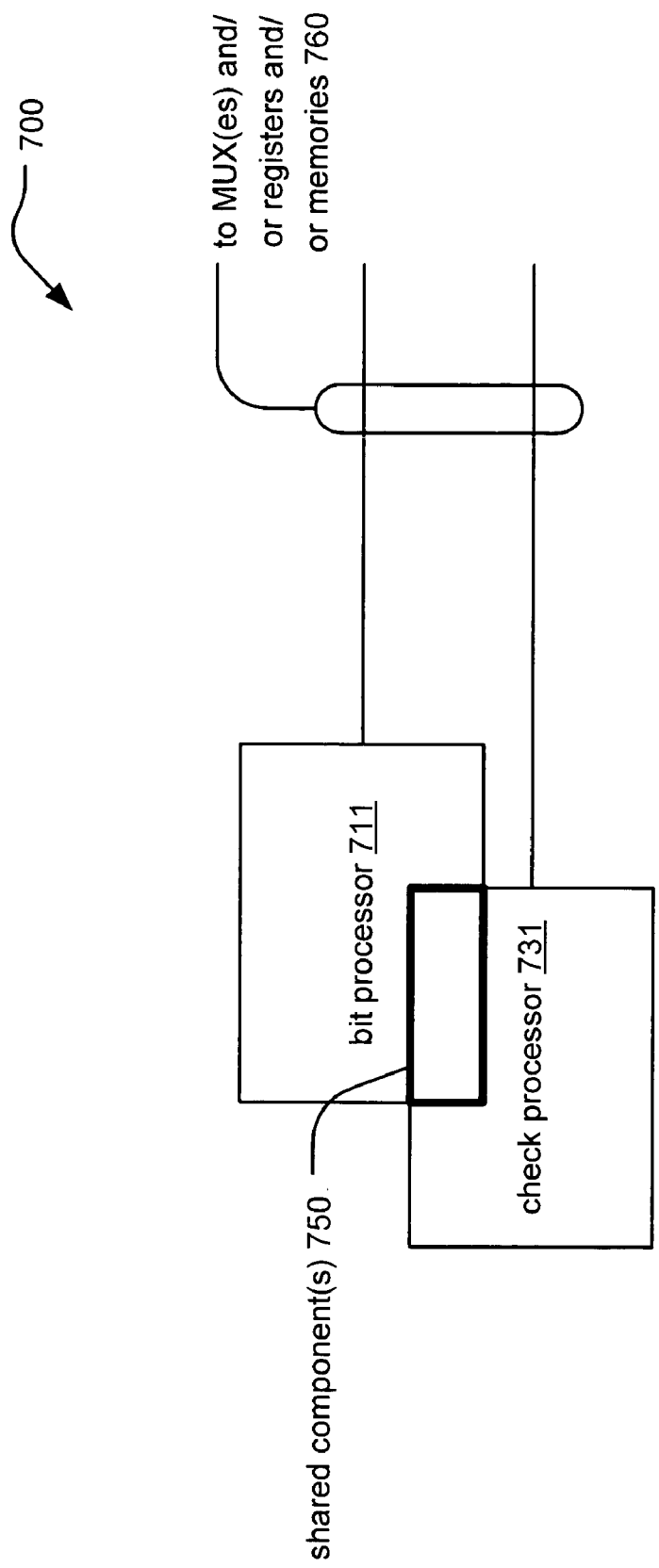
FIG. 7 illustrates an embodiment of a bit processor and a check processor such that at least one common component is employed by each.

FIG. 7 illustrates an embodiment 700 of a bit processor 711 and a check processor 731 such that at least one common component (shown by shared component(s) 750) is employed by each. Each of the bit processor 711 and a check processor 731 communicatively couples to a MUX and/or registers as shown by the lines 760.

This diagram shows how certain components may be shared and used when performing both bit node processing and check node processing by a bit processor 711 and a check processor 731, respectively. This efficiency in terms of reusing certain components can result in a reduction in complexity and a reduction in size (thanks to the re-use of components).

In some instances, each of the bit node processing and check node processing performs at least one similar calculation, and the functionality employed to perform this calculation can then be employed by each of the bit processor 711 and the check processor 731. For example, the shared component(s) 750 can be as simple as a single shared adder, subtractor, and/or other mathematical calculation functional block that is employed by each of the bit processor 711 and the check processor 731, respectively, when performing bit node processing and check node processing.

These examples show just some possible means by which certain components may be shared and used when performing both bit node processing and check node processing within the bit processor 711 and the check processor 731 that are implemented to perform bit node processing and check node processing. Clearly, other optimizations of shared components may also be performed to conserve device size and reduce complexity without departing from the scope and spirit of the invention.

Figure 8:
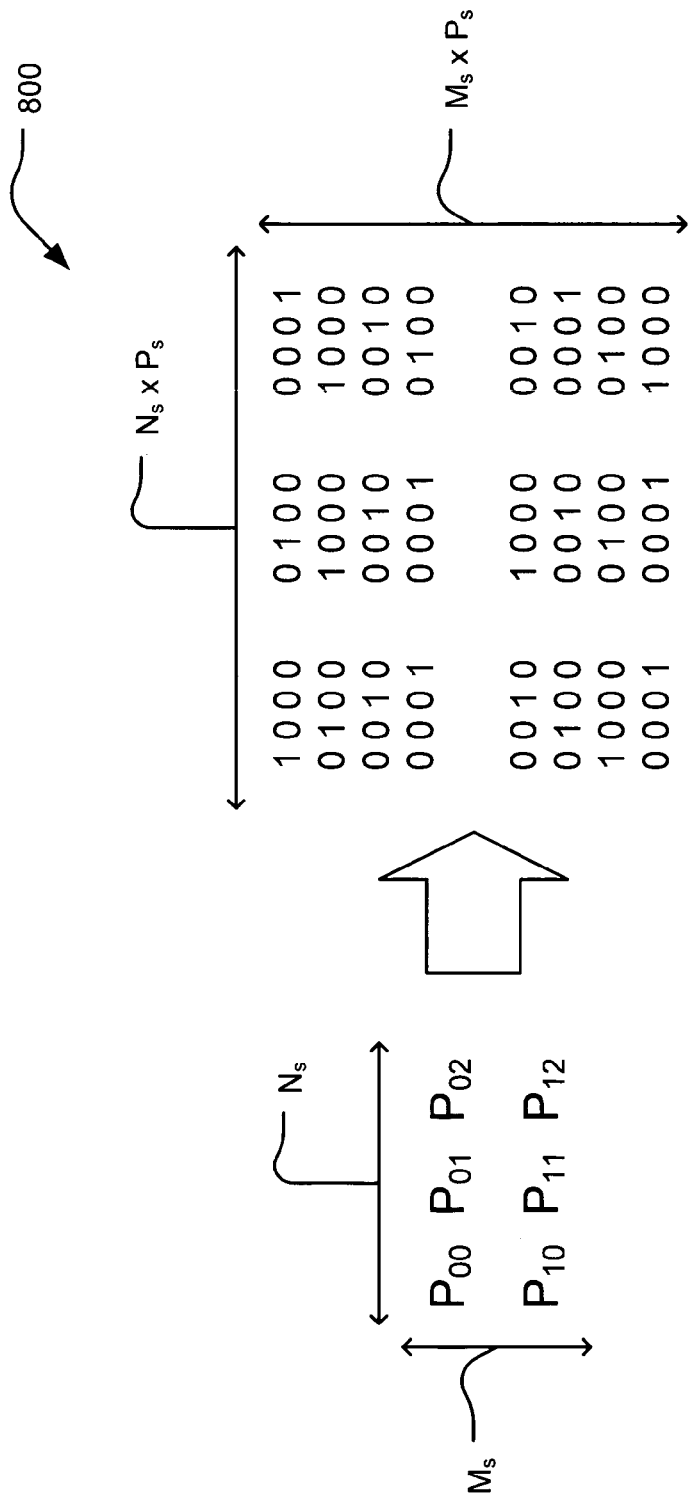
FIG. 8 illustrates an embodiment of a low density parity check matrix, H.

FIG. 8 illustrates an embodiment 800 of a low density parity check matrix, H. Several embodiments are depicted below with reference to the general structure of this low density parity check matrix, H. A low density parity check matrix, H, can be extracted from an LDPC bipartite graph (e.g., the one depicted in FIG. 3). It is noted that the low density parity check matrix, H, can correspond to a regular LDPC code or an irregular LDPC code in various embodiments.

It is noted, in the case of processing irregular LDPC codes, that the number of edges being processed per cycle may not always be the same. For example, one way to transform a regular LDPC code to an irregular LDPC code is to puncture or eliminate some of the non-zero entries therein. In such a case, a regular LDPC code can be considered in which n edges are processed each cycle in a given decoding approach (many embodiments of which are described in more detail below). For example, in one situation, x cycles are performed when processing a regular LDPC code, and n edges are processed in each cycle. If the low density parity check matrix corresponding to this regular LDPC code is modified by puncturing one of the "1"s (e.g., non-zero elements) in the upper left hand corner, for example, then only n−1 edges would be processed in the first cycle, and n edges would be processed in the second and subsequent cycles. Depending on the number of pluralities of bit edge messages and check edge messages into which the total number of bit edge messages and check edge messages are partitioned, respectively, the number of edges being processed in each cycle may be slightly different when processing irregular LDPC codes. The same analysis provided above can also be applied to even more parallel approaches without departing from the scope and spirit of the invention when dealing with irregular LDPC codes, in that, different numbers of edges may be processed during different cycles.

Looking at the left hand side of this diagram, it can be seen that the low density parity check matrix, H, is composed of a plurality of permutation matrices, depicted by $P_{00}$, $P_{01}$, $P_{02}$, $P_{10}$, $P_{11}$, and $P_{12}$. The number of columns of permutation matrices of the low density parity check matrix, H, is shown as being $N_s$, and number of rows of permutation matrices of the low density parity check matrix, H, is shown as being $M_s$. $P_s$ is the order the permutation matrix that is used to generate the sub-matrices of the low density parity check matrix, H. $N=N_s \times P_s$ is the number of bits of the LDPC code, and $M=M_s \times P_s$ is the number of rules (or check) that these bits have to satisfy for proper error correction decoding. The total number of edges of the LDPC bipartite graph, that selectively connect the bit nodes to the check nodes, is $N_s \times M_s \times P_s$.

Looking at the right hand side of this diagram, it can be seen that the number of columns of the low density parity check matrix, H, is shown as being $N_s \times P_s$. The number of rows of the low density parity check matrix, H, is shown as being $M_s \times P_s$.

Clearly, other forms of his low density parity check matrices, H, can be employed as well without departing from the scope and spirit of the invention. This particular low density parity check matrix, H, is employed for illustration with reference to some possible embodiments described below. For another low density parity check matrix, H, other appropriate partial parallel designs can also be achieved using a similar design approach as the one presented here.

Various embodiments are presented below by which the decoding processing of an LDPC coded signal can be performed by sweeping through the various sub-matrices of the low density parity check matrix, H, corresponding to the LDPC code. The low density parity check matrix, H, is partitioned into a plurality of sub-matrices, and these sub-matrices are processed using any one or combination of the various sweeping approaches presented below.

Several of the embodiments presented below are illustrated and described using a low density parity check matrix, H, that is composed of a plurality of permutation matrices as follows.

$$H = [[P_{00}, P_{01}, P_{02}, P_{03}, P_{04}, P_{05}], [P_{10}, P_{11}, P_{12}, P_{13}, P_{14}, P_{15}]]$$

This low density parity check matrix, H, is provided in many of the various diagrams as well to assist the reader in understanding which portions of the low density parity check matrix, H, are being processing during various steps of both bit node processing and check node processing.

This particular low density parity check matrix, H, includes $N_s=6$, and $M_s=2$. In other words, the low density parity check matrix, H, includes 6 columns of sub-matrices and 2 rows of sub-matrices. More specifically, each of the sub-matrices in this particular low density parity check matrix, H, is a 4×4 sub-matrix (i.e., $P_s=4$). Therefore, it can be seen that the number of columns of the low density parity check matrix, H, is shown as being $N_s \times P_s = 6 \times 4 = 24$. The number of rows of the low density parity check matrix, H, is shown as being $M_s \times P_s = 2 \times 4 = 8$.

It is of course noted that while this particular low density parity check matrix, H, is used for illustration and to assist the reader to comprehend the various embodiments described herein, clearly any other sized low density parity check matrix, H, could also be employed without departing from the scope and spirit of the invention.

Figure 9:
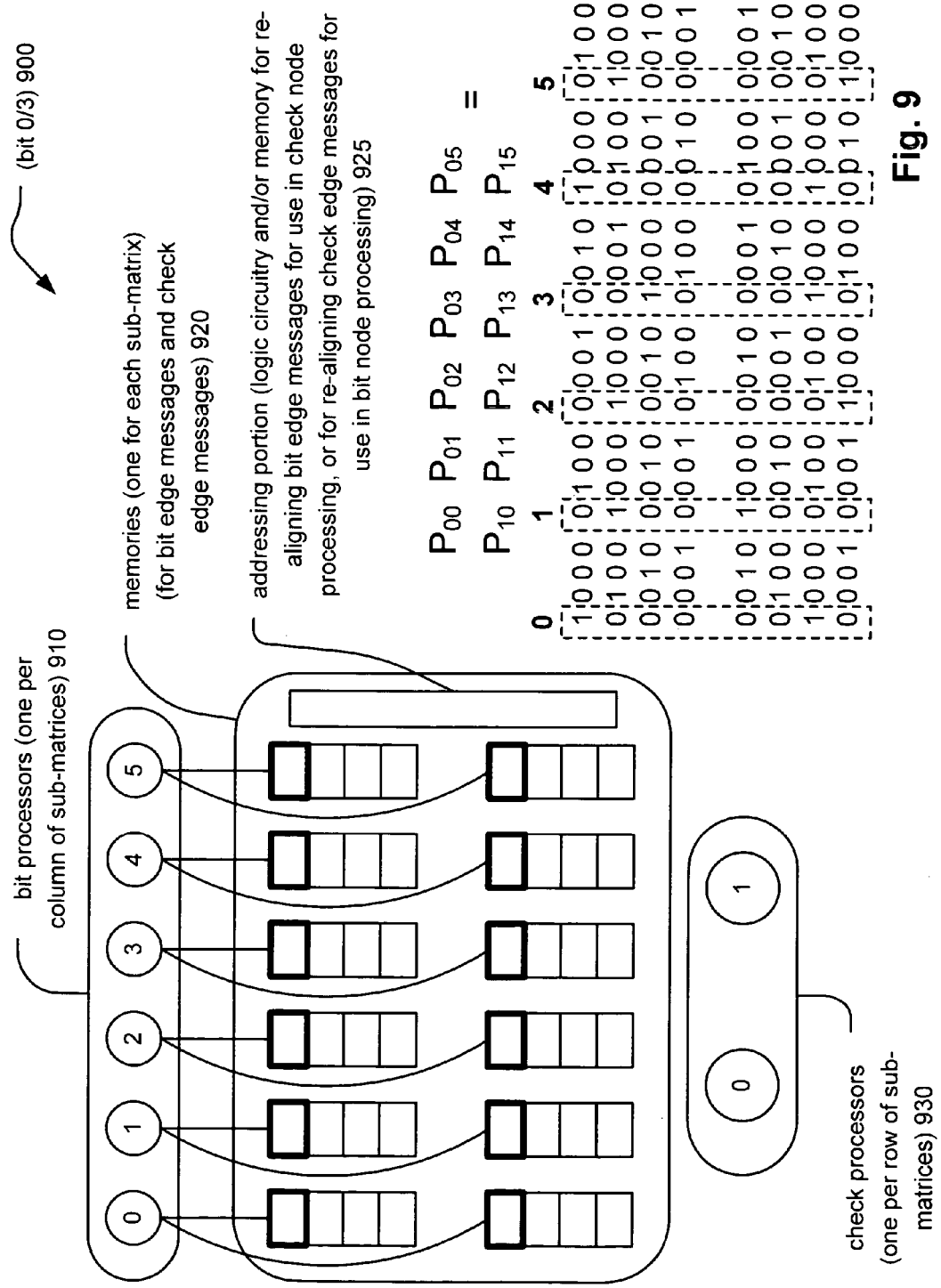
FIG. 9 and FIG. 10 illustrate embodiments of bit node processing (0/3) and (1/3) when employing 4 cycles, respectively.
Figure 10:
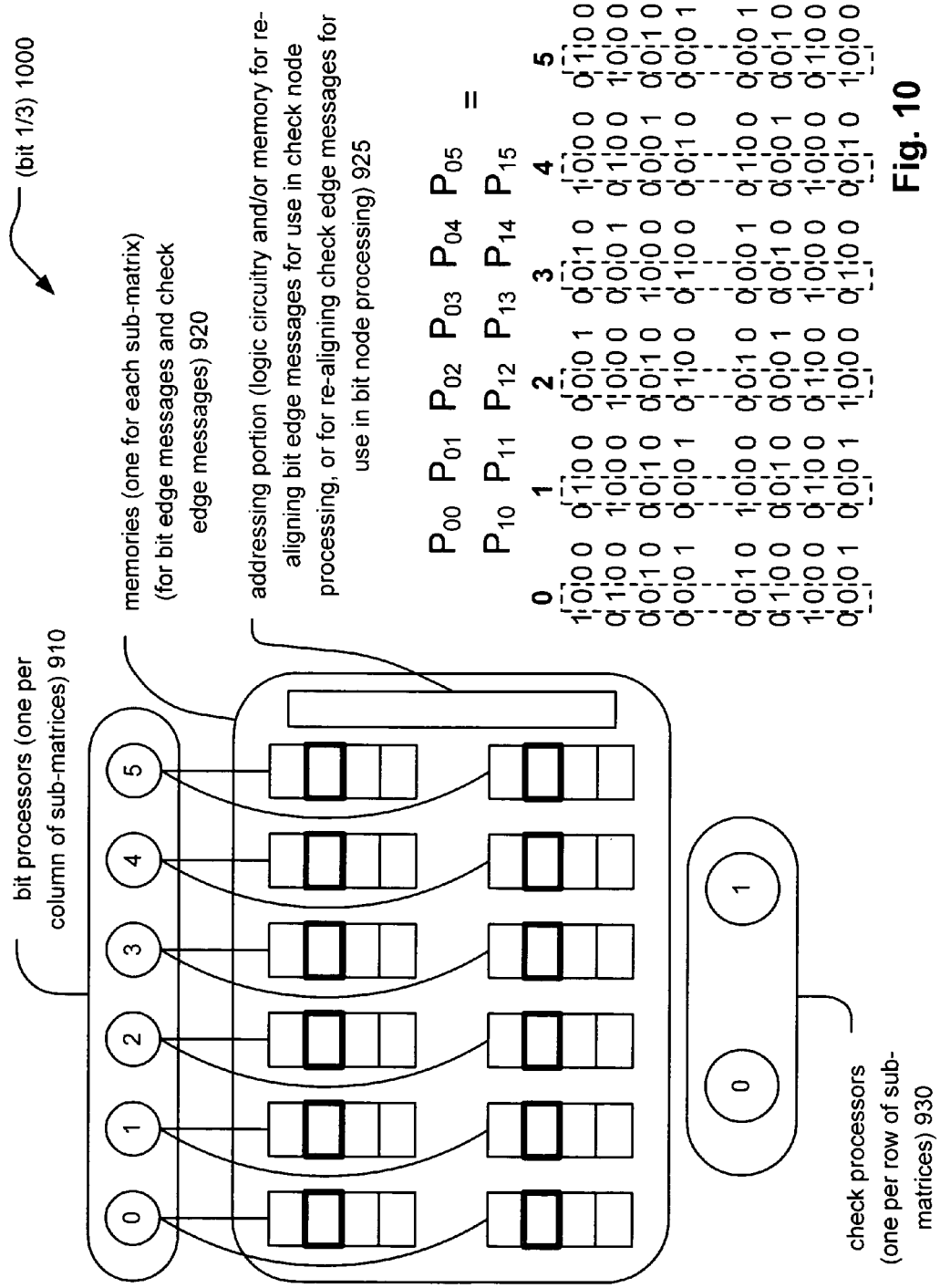

FIG. 9 and FIG. 10 illustrate embodiments 900 and 1000 of bit node processing (0/3) and (1/3) when employing 4 cycles, respectively.

In total, 4 cycles are required to perform this approach to bit node processing. The total number of bit processors 910 corresponds to the number of columns of sub-matrices of the low density parity check matrix, H, of the LDPC code. For example, this embodiment shows that there are $N_s=6$ columns of the sub-matrices, so 6 bit processors 910 are shown. However, for a low density parity check matrix, H, having larger (or smaller) sized sub-matrices having a different number of columns, the number of bit processors 910 could be adjusted accordingly.

The embodiments 900 and 1000 show the cycles 0 and 1 of a total number of 4 cycles (i.e., 0, 1, 2, and 3). Also, the embodiments 900 and 1000 employ a total number of check processors 930 that corresponds to the number of rows sub-matrices of the low density parity check matrix, H, of the LDPC code. For example, this embodiment shows that the sub-matrices each include $M_s=2$ rows, so 2 check processors 930 are shown. However, for a low density parity check matrix, H, having larger (or smaller) sized sub-matrices having a different number of rows, the number of check processors 930 could also be adjusted accordingly (just as the number of bit processors 910 could be adjusted, as described above).

It is noted that the total number of bit nodes and the total number of check nodes can be deduced from the LDPC bipartite graph representative of the LDPC code. This graph also depicts the selective connectivity of the edges between certain of the bit nodes and the check nodes. When performing bit node processing, the bit edge messages for the corresponding bit nodes are calculated/updated. When performing check node processing, the check edge messages for the corresponding check nodes are calculated/updated.

In addition, a plurality of memories 920 is employed to store the bit edge messages and the check edge messages when performing bit node processing and check node processing. The total number of memories 920 employed can be selected to correspond to the number of sub-matrices into which the low density parity check matrix, H, is partitioned. For example, this embodiment shows a low density parity check matrix, H, that is composed of a plurality of permutation matrices, depicted by $P_{00}, P_{01}, P_{02}, P_{03}, P_{04}, P_{05}, P_{11}, P_{11}, P_{12}, P_{13}, P_{14},$ and $P_{15}$. The number of columns of permutation matrices of the low density parity check matrix, H, is shown as being $N_s=6$, and number of rows of permutation matrices of the low density parity check matrix, H, is shown as being $M_s=2$. Therefore, in this embodiment, the total number of memories 920 corresponds to the total number of sub-matrices: $N_s \times M_s = 6 \times 2 = 12$.

The plurality of memories 920 is employed store the edge messages (i.e., bit edge messages updated during bit node processing, and the check edge messages updated during check node processing).

Using this approach, $P_s$ cycles are performed during each bit node processing step, and each bit processor communicates with $M_s$ memories of the memories 920 in the embodiment depicted. Therefore, in this particular embodiment, $P_s=4$ cycles are performed during each bit node processing step, and each bit processor communicates with $M_s=2$ memories. Because of the use of the memories 920 in this approach, no MUXes are needed to allow for the selective communicative coupling between memories 920 and the check processors 930. Each bit processor is selectively capable to be communicatively coupled to $M_s$ memories, and each bit processor communicatively couples with $M_s$ of the memories 920 during any one cycle. The total number of edges that is processed per cycle is $(N_s \times M_s)$.

In addition, in each of the embodiment of FIG. 9 and FIG. 10, an addressing portion 925 is generally depicted. This can be implemented as a plurality of permuters that is capable to permute the bit edge messages (after being updated) when retrieved from the memories 920 for use in check node processing. Generally speaking, this addressing portion 925 can be viewed as being permuters, logic circuitry and/or memory for re-aligning bit edge messages for use in check node processing, or for re-aligning check edge messages for use in bit node processing. For example, combinational gates (e.g., some combination of logic gates) can be employed to compute the addresses based on the current step number or on the previous address value. One or more ROMs (Read Only Memories) could also be employed to look up the addresses based on the current step number or on the previous address value (e.g., in a LUT (Look-Up Table) type approach). Of course, as described in other areas, a portion of each of the individual memory locations of the memories 920 could be provisioned to store the next address. This way, a memory read operation then retrieved not only the edge message, but its next permuted address as a side-effect. Any of the embodiments depicted herein can include one or more components capable of performing this functionality to ensure the appropriate ordering of either the bit edge messages or the check edge messages, as desired in a given application.

Generally speaking, a particular design often ensures that the edge messages are in a "bit friendly" order or a "check friendly" order. In other words, if the edge messages are in a "bit friendly" order, the bit node processing can be performed without realigning the edge messages, but the edge messages must be appropriately aligned for check node processing. Alternatively, if the edge messages are in a "check friendly" order, the check node processing can be performed without realigning the edge messages, but the edge messages must be appropriately aligned for bit node processing.

If desired, each memory storage location of the memory 925 can be designed to include a portion memory (i.e., some desired number of bits) to allow for the addressing required to ensure that the edge messages are appropriately aligned for use in either bit node processing or check node processing. For example, a small "tag" or addressing portion 925 can be added to each edge message as it is being stored in any one of the memories 920. This way, when the edge message is retrieved for use in check node processing, assuming the edge messages are generally aligned in a "bit friendly" way, then the addressing portion 925 can ensure that the appropriate permutation is taken before performing the check node processing (i.e., by way of how the edge messages are retrieved via the addressing). This can be a more flexible and adaptable approach that simply employing a hard wired permutation arrangement.

Referring to the embodiment 900 of the FIG. 9 of the bit node processing through the low density parity check matrix, H, during the cycle (0/3), the left hand most columns of each of the individual sub-matrices undergo bit node processing. For example, it can be seen that the non-zero element portion of each left hand most column of each sub-matrix is processed and the updated edge message is stored in the top most memory location of the corresponding memory within the memories 920. Again, an addressing portion 925 can be implemented in conjunction with each memory storage location of each of the memories 920.

Referring to the embodiment 1000 of the FIG. 10 of the bit node processing through the low density parity check matrix, H, during the cycle (1/3), the $2^{nd}$ to left hand most columns of each of the individual sub-matrices undergo bit node processing. For example, it can be seen that the non-zero element portion of each $2^{nd}$ to left hand most column of each sub-matrix is processed and the updated edge message is stored in the $2^{nd}$ to top most memory location of the corresponding memory within the memories 920. Again, an addressing portion 925 can be implemented in conjunction with each memory storage location of each of the memories 920.

The bit node processing continues along this approach until each of the individual columns of each of the sub-matrices of the low density parity check matrix, H, have undergone bit node processing. It can be seen that the processing is on a per column of each sub-matrix basis. In other words, the bit node processing is performed by sweeping through the various columns of the sub-matrices.

The check node processing is somewhat analogous, in that, the check node processing is performed by sweeping through the various rows of the sub-matrices. This embodiment operates by processing all of the $1^{st}$ columns of each sub-matrix, then all of the $2^{nd}$ columns of each sub-matrix, and so on. However, as other embodiments depict and describe below, it can be seen that selected numbers of sub-matrices can be processed in this manner as well. For example, the processing can alternatively be performed by processing the $1^{st}$ columns of each sub-matrix of a $1^{st}$ plurality of sub-matrices, then processing the $1^{st}$ columns of each sub-matrix of a $2^{nd}$ plurality of sub-matrices and so on until all of the $1^{st}$ columns of all of the sub-matrices have been processed. Then the processing continues by processing the $2^{nd}$ columns of each sub-matrix of the $1^{st}$ plurality of sub-matrices, then processing the $2^{nd}$ columns of each sub-matrix of the $2^{nd}$ plurality of sub-matrices and so on until all of the $2^{nd}$ columns of all of the sub-matrices have been processed. There is a wide variety of approaches by which the sweeping processing can be performed.

Figure 11:
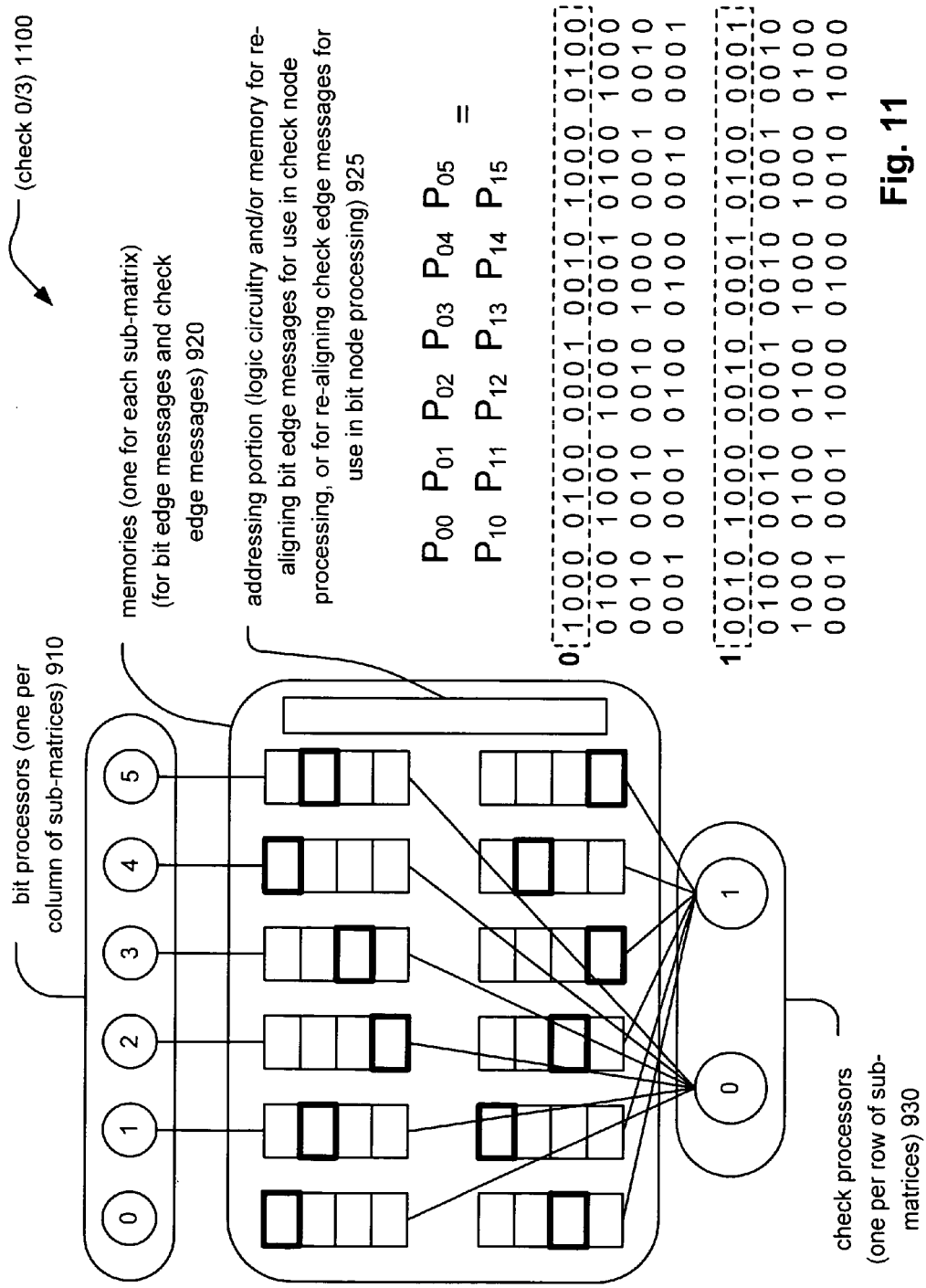
FIG. 11 and FIG. 12 illustrate embodiments of check node processing (0/3) and (1/3) when employing 4 cycles, respectively.
Figure 12:
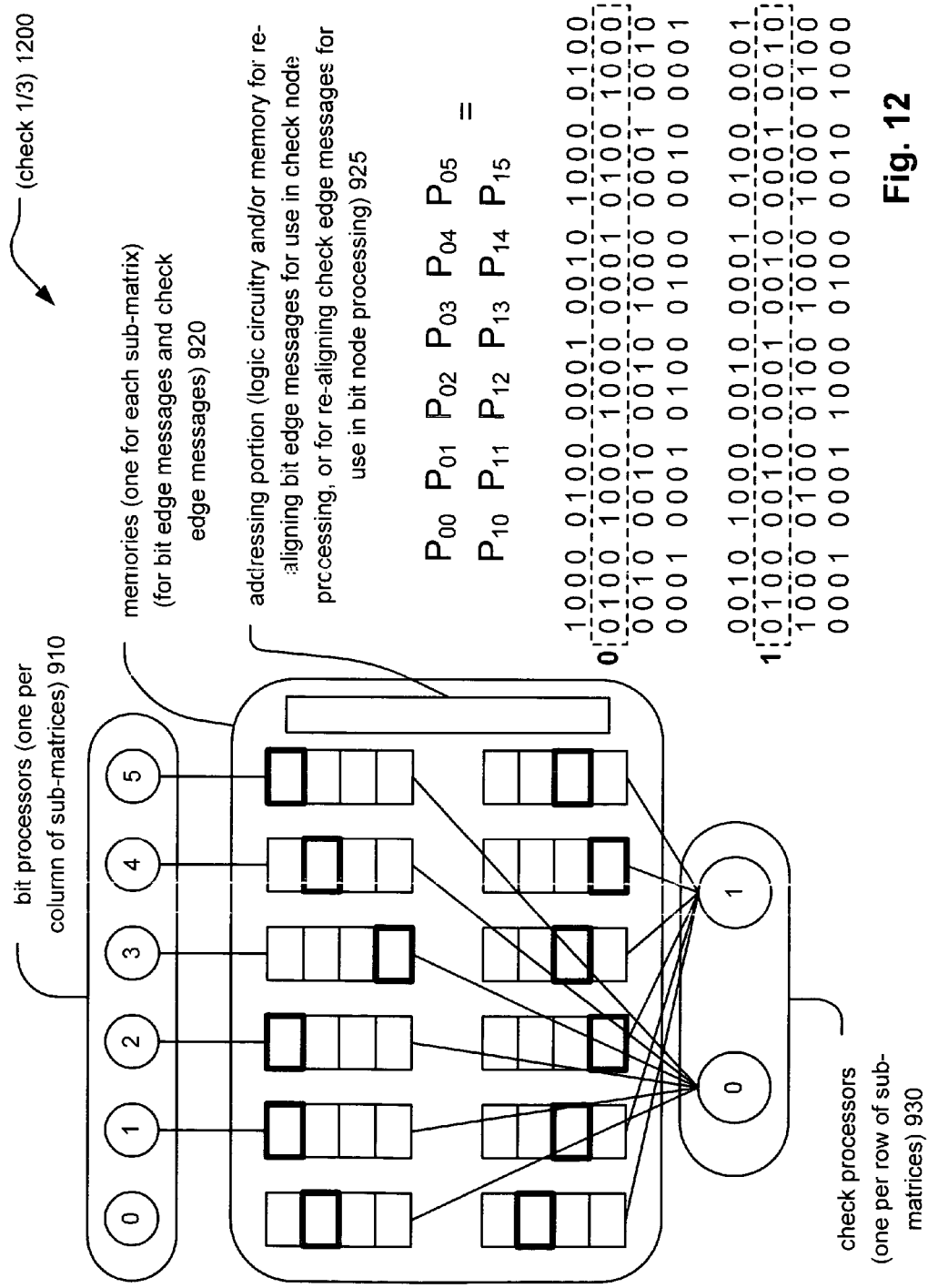

FIG. 11 and FIG. 12 illustrate embodiments 1100 and 1200 of check node processing (0/3) and (1/3) when employing 4 cycles, respectively. The embodiments 1100 and 1200 of check node processing (0/3) and (1/3) (as well as cycles (2/3) and (3/3)) operate in conjunction with the embodiments 900 and 1000 of bit node processing (0/3) and (1/3) (as well as cycles (2/3) and (3/3)).

As mentioned above, the addressing portion 925 can be implemented to ensure that the bit edge messages (after being updated during bit node processing and stored in the memories 920) are retrieved in the appropriate order for use in check node processing. In other words, each individual memory of the memories 920 can be implemented to be operable to generate the corresponding addresses in the permuted order to ensure this appropriate alignment for check node processing. Clearly, the converse could be implemented as well without departing from the scope and spirit of the invention, in that, the addressing portion 925 can be implemented to ensure that the check edge messages (after being updated during check node processing and stored in the memories 920) are retrieved in the appropriate order for use in bit node processing.

Using this approach, $P_s$ cycles are performed during each check node processing step, and check bit processor communicates with $N_s$ memories of the memories 920 in the embodiment depicted. Therefore, in this particular embodiment, $P_s=4$ cycles are performed during each bit node processing step, and each check processor communicates with $N_s=6$ memories. Because of the use of the memories 920 in this approach, as well as the use of the addressing portion 925, no MUXes are needed to allow for the selective communicative coupling between memories 920 and check processors 930. Each check processor is selectively capable to be communicatively coupled to $N_s$ memories, and each check processor communicatively couples with $N_s$ of the memories 920 during any one cycle. The total number of edges that is processed per cycle is ($N_s \times M_s$).

Referring to the embodiment 1100 of the FIG. 11 of the check node processing through the low density parity check matrix, H, during the cycle (0/3), the top most rows of each of the individual sub-matrices undergo check node processing. For example, it can be seen that the non-zero element portion of each top most row of each sub-matrix is processed and the updated edge message is stored in the appropriately addressed memory location of the corresponding memory within the memories 920. Again, the addressing portion 925 can be implemented in conjunction with each memory storage location of each of the memories 920 to ensure the proper alignment of the edge messages between bit node processing and check node processing.

Referring to the embodiment 1200 of the FIG. 12 of the check node processing through the low density parity check matrix, H, during the cycle (1/3), the $2^{nd}$ to top most rows of each of the individual sub-matrices undergo check node processing. For example, it can be seen that the non-zero element portion of each $2^{nd}$ to top most row of each sub-matrix is processed and the updated edge message is stored in the appropriately addressed memory location of the corresponding memory within the memories 920.

The check node processing continues along this approach until each of the individual rows of each of the sub-matrices of the low density parity check matrix, H, have undergone check node processing. It can be seen that the processing is on a per row of each sub-matrix basis. In other words, the check node processing is performed by sweeping through the various rows of the sub-matrices.

FIG. 13, FIG. 14, FIG. 15, and FIG. 16 illustrate embodiments 1300, 1400, 1500, and 1600 of bit node processing (0/7), (1/7), (2/7), and (3/7) when employing 8 cycles, respectively. This bit node processing approach operates by only processing the $1^{st}$ columns of each sub-matrix of a $1^{st}$ plurality of sub-matrices, then processing the $1^{st}$ columns of each sub-matrix of a $2^{nd}$ plurality of sub-matrices and so on until all of the $1^{st}$ columns of all of the sub-matrices have been processed. Then the processing continues by processing the $2^{nd}$ columns of each sub-matrix of the $1^{st}$ plurality of sub-matrices, then processing the $2^{nd}$ columns of each sub-matrix of the $2^{nd}$ plurality of sub-matrices and so on until all of the $2^{nd}$ columns of all of the sub-matrices have been processed. This processing continues until all of the sub-matrices have undergone bit node processing.

In total, 8 cycles are required to perform this approach to bit node processing. The total number of bit processors 1310 corresponds to the number of columns of sub-matrices of the low density parity check matrix, H, of the LDPC code. For example, this embodiment shows that there are $N_s=6$ columns of the sub-matrices, so 6 bit processors 1310 are shown. However, for a low density parity check matrix, H, having larger (or smaller) sized sub-matrices having a different number of columns, the number of bit processors 1310 could be adjusted accordingly.

The embodiments 1300, 1400, 1500, and 1600 show the cycles 0, 1, 2, and 3 of a total number of 8 cycles (i.e., 0, 1, ..., 7). Also, the embodiments 1300, 1400, 1500, and 1600 employ a total number of check processors 1330 that corresponds to the number of rows sub-matrices of the low density parity check matrix, H, of the LDPC code. For example, this embodiment shows that the sub-matrices each include $M_s=2$ rows, so 2 check processors 1330 are shown. However, for a low density parity check matrix, H, having larger (or smaller) sized sub-matrices having a different number of rows, the number of check processors 1330 could also be adjusted accordingly (just as the number of bit processors 1310 could be adjusted, as described above).

In addition, a plurality of memories 1320 is employed to store the bit edge messages and the check edge messages when performing bit node processing and check node processing. The total number of memories 1320 employed can be selected to correspond to the number of sub-matrices into which the low density parity check matrix, H, is partitioned. For example, this embodiment shows a low density parity check matrix, H, that is composed of a plurality of permutation matrices, depicted by $P_{00}, P_{01}, P_{02}, P_{03}, P_{04}, P_{05}, P_{10}, P_{11}, P_{12}, P_{13}, P_{14}$, and $P_{15}$. The number of columns of permutation matrices of the low density parity check matrix, H, is shown as being $N_s$=6, and number of rows of permutation matrices of the low density parity check matrix, H, is shown as being $M_s$=2. Therefore, in this embodiment, the total number of memories 1320 corresponds to the total number of sub-matrices: $N_s \times M_s$=6×2=12.

The plurality of memories 1320 is employed store the edge messages (i.e., bit edge messages updated during bit node processing, and the check edge messages updated during check node processing).

Using this approach, $P_s \times M_s$ cycles are performed during each bit node processing step, and each bit processor communicates with 1 memory of the memories 1320 in each cycle. Therefore, in this particular embodiment, $P_s \times M_s$=4× 2=8 cycles are performed during each bit node processing step. Each bit processor is selectively capable to be communicatively coupled to $M_s$ memories, and each bit processor communicatively couples with 1 memory of the memories 1320 during any one cycle. To effectuate the appropriate communicative coupling between each bit processor of the bit processors 1310 and the corresponding and appropriate memory of the memories 1320, MUXes can be employed as described above with reference to another embodiment. If the MUX approach is desired, then the total number of $M_s$ to 1 MUXes required is $N_s$. The total number of edges that is processed per cycle is $N_s$.

Analogous to other embodiments described above, in each of the embodiment of FIG. 13, FIG. 14, FIG. 15, and FIG. 16, an addressing portion 1325 is generally depicted. This can be implemented as a plurality of permuters that is capable to permute the bit edge messages (after being updated) when retrieved from the memories 1320 for use in check node processing. The addressing portion 1325 can be viewed to include at least all of the options and capabilities of the addressing portion 925 described with reference to other embodiments as well.

Figure 13:
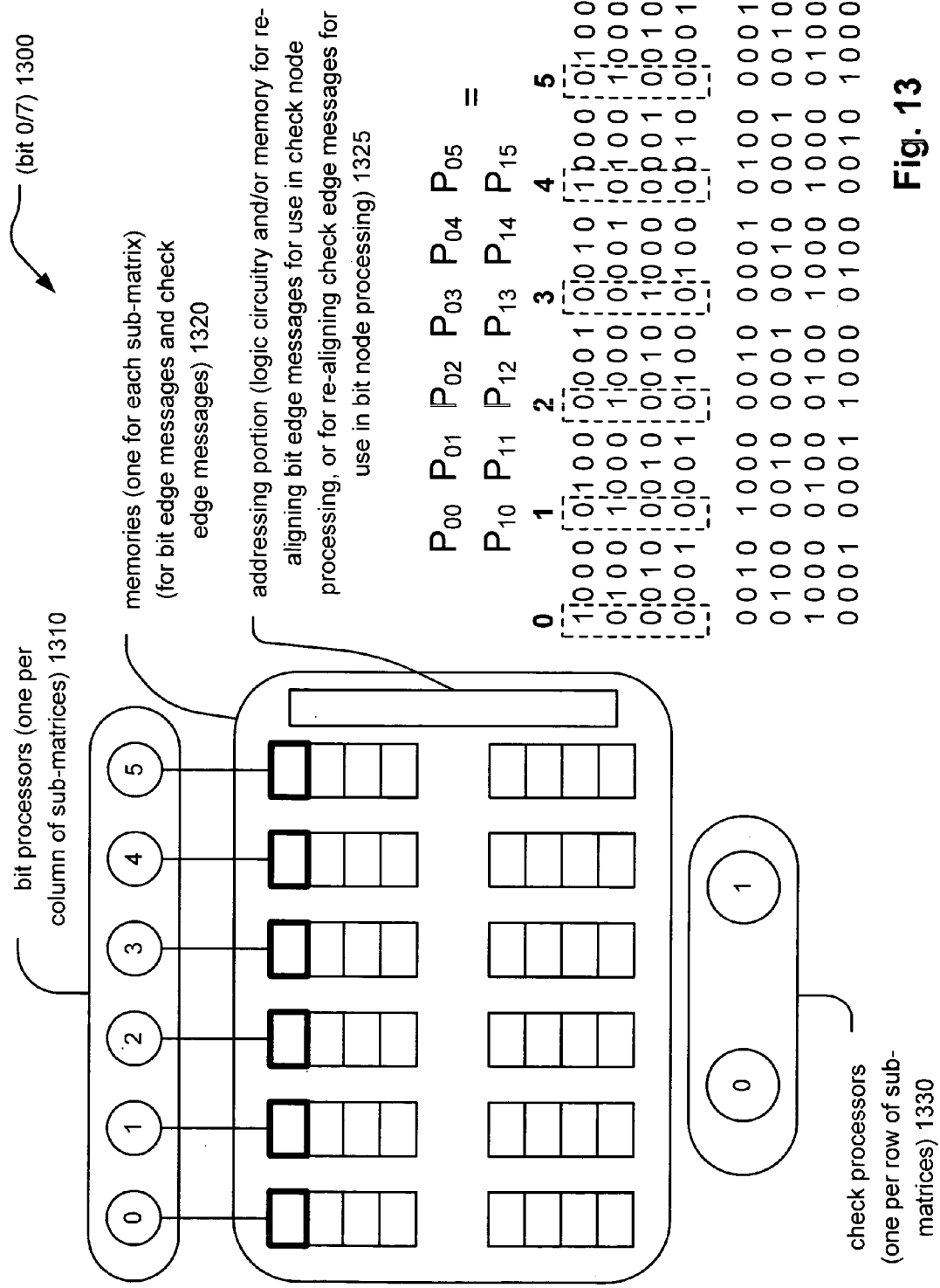
FIG. 13, FIG. 14, FIG. 15, and FIG. 16 illustrate embodiments of bit node processing (0/7), (1/7), (2/7), and (3/7) when employing 8 cycles, respectively.

Referring to the embodiment 1300 of the FIG. 13 of the check node processing through the low density parity check matrix, H, during the cycle (0/7), the left hand most columns of each of the individual sub-matrices situated in the first or top row of sub-matrices undergo bit node processing. For example, it can be seen that the non-zero element portion of each left hand most column of each sub-matrix situated in the first or top row of sub-matrices is processed and the updated edge message is stored in the top most memory location of the corresponding memory situated in the top half of the memories 1320. Again, an addressing portion 1325 can be implemented in conjunction with each memory storage location of each of the memories 1320.

Figure 14:
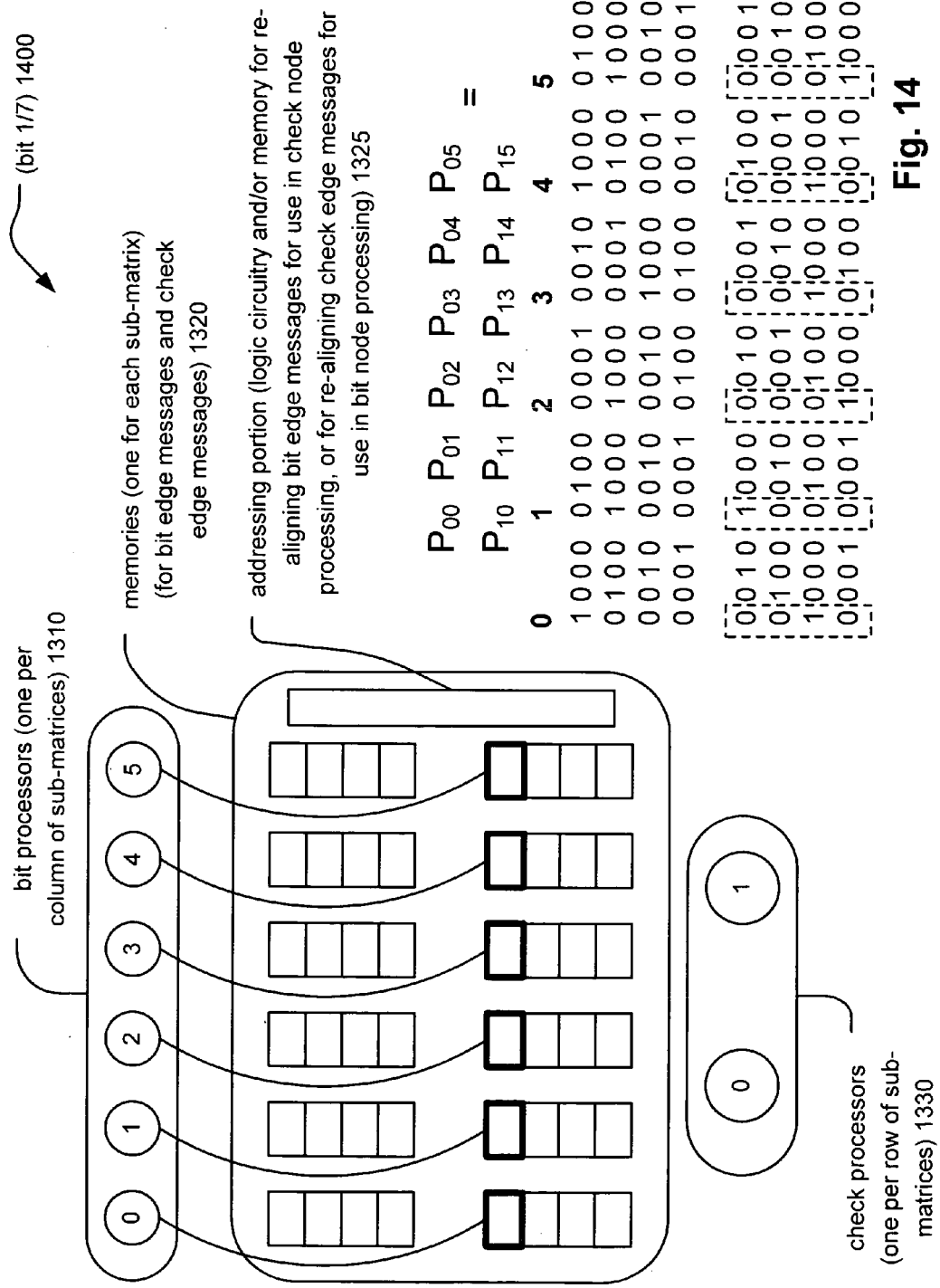

Referring to the embodiment 1400 of the FIG. 14 of the check node processing through the low density parity check matrix, H, during the cycle (1/7), the left hand most columns of each of the individual sub-matrices situated in the second or bottom row of sub-matrices undergo bit node processing. For example, it can be seen that the non-zero element portion of each left hand most column of each sub-matrix situated in the second or bottom row of sub-matrices is processed and the updated edge message is stored in the top most memory location of the corresponding memory situated in the bottom half of the memories 1320.

Figure 15:
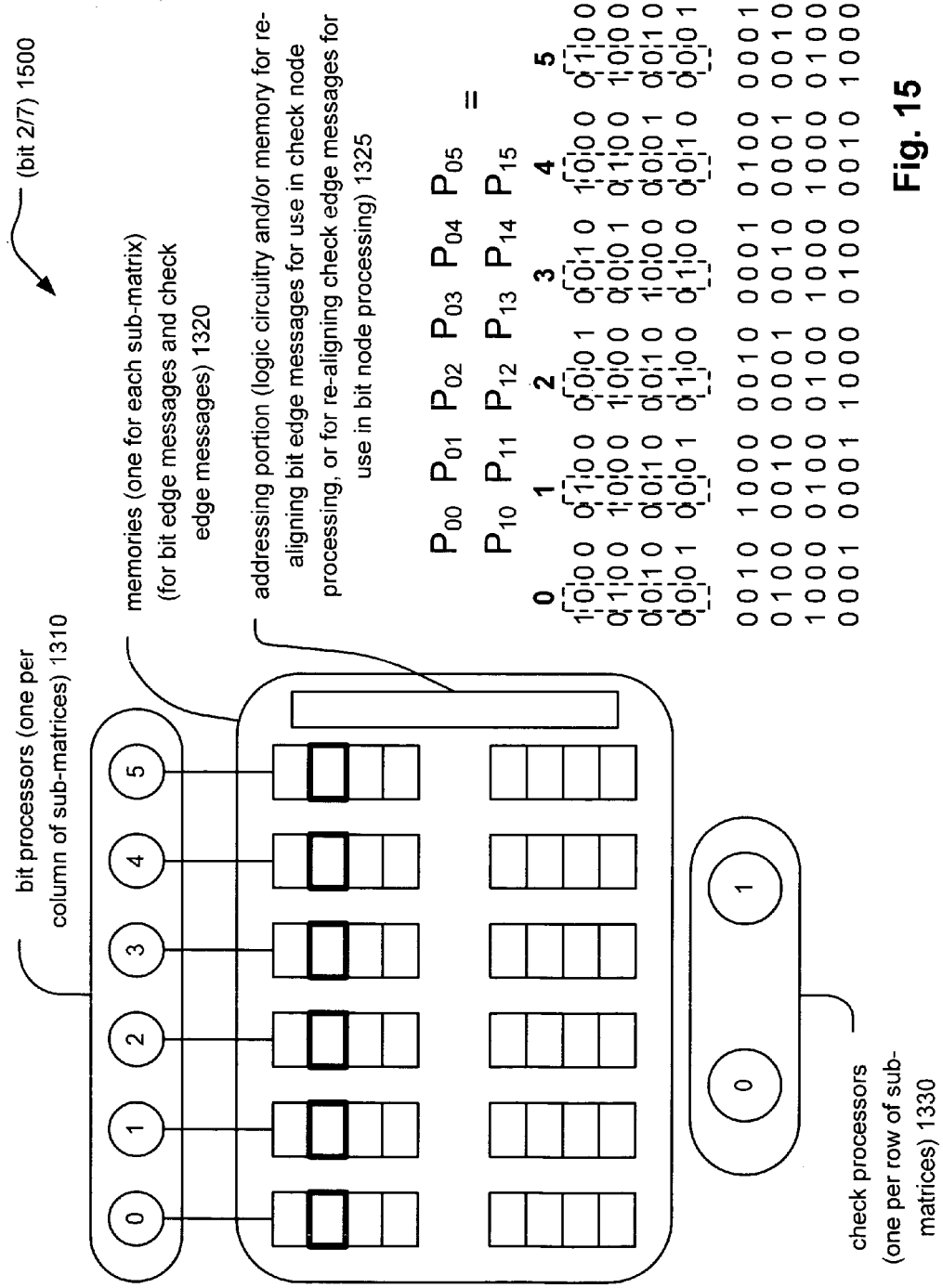

Referring to the embodiment 1500 of the FIG. 15 of the check node processing through the low density parity check matrix, H, during the cycle (2/7), the $2^{nd}$ to left hand most columns of each of the individual sub-matrices situated in the first or top row of sub-matrices undergo bit node processing. For example, it can be seen that the non-zero element portion of each $2^{nd}$ to left hand most column of each sub-matrix situated in the first or top row of sub-matrices is processed and the updated edge message is stored in the $2^{nd}$ to top most memory location of the corresponding memory situated in the top half of the memories 1320.

Figure 16:
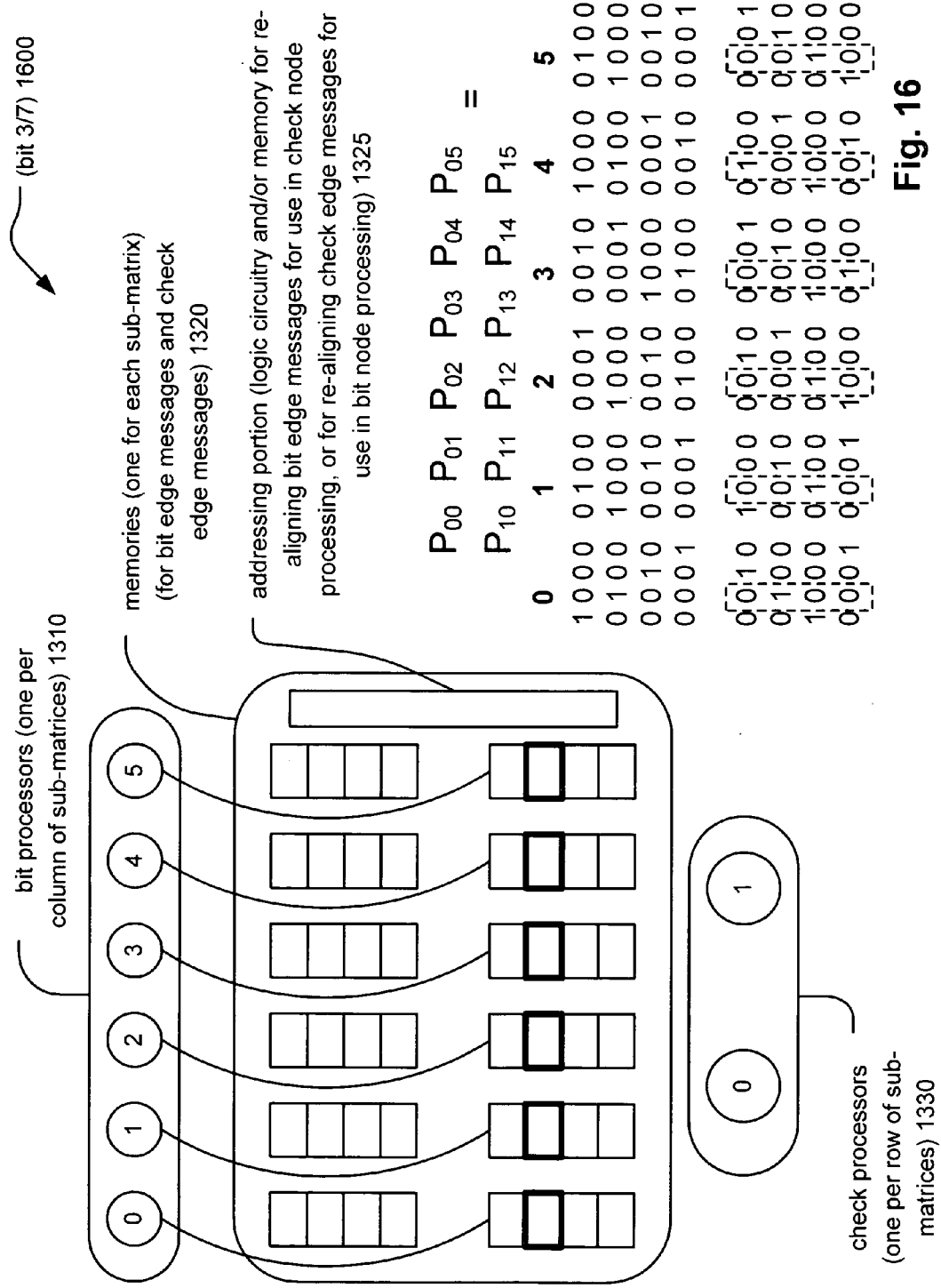

Referring to the embodiment 1600 of the FIG. 16 of the check node processing through the low density parity check matrix, H, during the cycle (3/7), the $2^{nd}$ to left hand most columns of each of the individual sub-matrices situated in the second or bottom row of sub-matrices undergo bit node processing. For example, it can be seen that the non-zero element portion of each $2^{nd}$ to left hand most column of each sub-matrix situated in the second or bottom row of sub-matrices is processed and the updated edge message is stored in the $2^{nd}$ to top most memory location of the corresponding memory situated in the bottom half of the memories 1320.

The bit node processing continues along this approach until each of the individual columns of each of the sub-matrices of the low density parity check matrix, H, have undergone bit node processing. It can be seen that the processing is on a per column of each sub-matrix basis, and further on a per plurality of sub-matrices basis (e.g., sub-matrices in the first row and then the sub-matrices in the second row, and so on). In other words, the bit node processing is performed by sweeping through the various columns of selected sub-matrices of all of the sub-matrices.

FIG. 17, FIG. 18, FIG. 19, and FIG. 20 illustrate embodiments 1700, 1800, 1900, and 2000 of check node processing (0/23), (1/23), (6/23), and (7/23) when employing 24 cycles, respectively. This check node processing approach operates by only processing the processing the $1^{st}$ rows of each sub-matrix of a $1^{st}$ plurality of sub-matrices, then processing the $1^{st}$ rows of each sub-matrix of a $2^{nd}$ plurality of sub-matrices and so on until all of the $1^{st}$ rows of all of the sub-matrices have been processed. Then the processing continues by processing the $2^{nd}$ rows of each sub-matrix of the $1^{st}$ plurality of sub-matrices, then processing the $2^{nd}$ rows of each sub-matrix of the $2^{nd}$ plurality of sub-matrices and so on until all of the $2^{nd}$ rows of all of the sub-matrices have been processed. This processing continues until all of the sub-matrices have undergone check node processing.

Using this approach, $P_s \times N_s$ cycles are performed during each check node processing step, and each check processor communicates with 1 memory of the memories 1320 in each cycle. Therefore, in this particular embodiment, $P_s \times N_s$=4× 6=24 cycles are performed during each check node processing step. Each check processor is selectively capable to be communicatively coupled to $N_s$ memories, and each check processor communicatively couples with 1 memory of the memories 1320 during any one cycle. To effectuate the appropriate communicative coupling between each check processor of the check processors 1330 and the corresponding and appropriate memory of the memories 1320, MUXes can be employed as described above with reference to another embodiment. If the MUX approach is desired, then the total number of $N_s$ to 1 MUXes required is $M_s$. The total number of edges that is processed per cycle is $M_s$. Again, it is noted that each memory of the memories 1320 can be implemented to generate the addresses in the appropriate permuted order to ensure proper check node processing.

Figure 17:
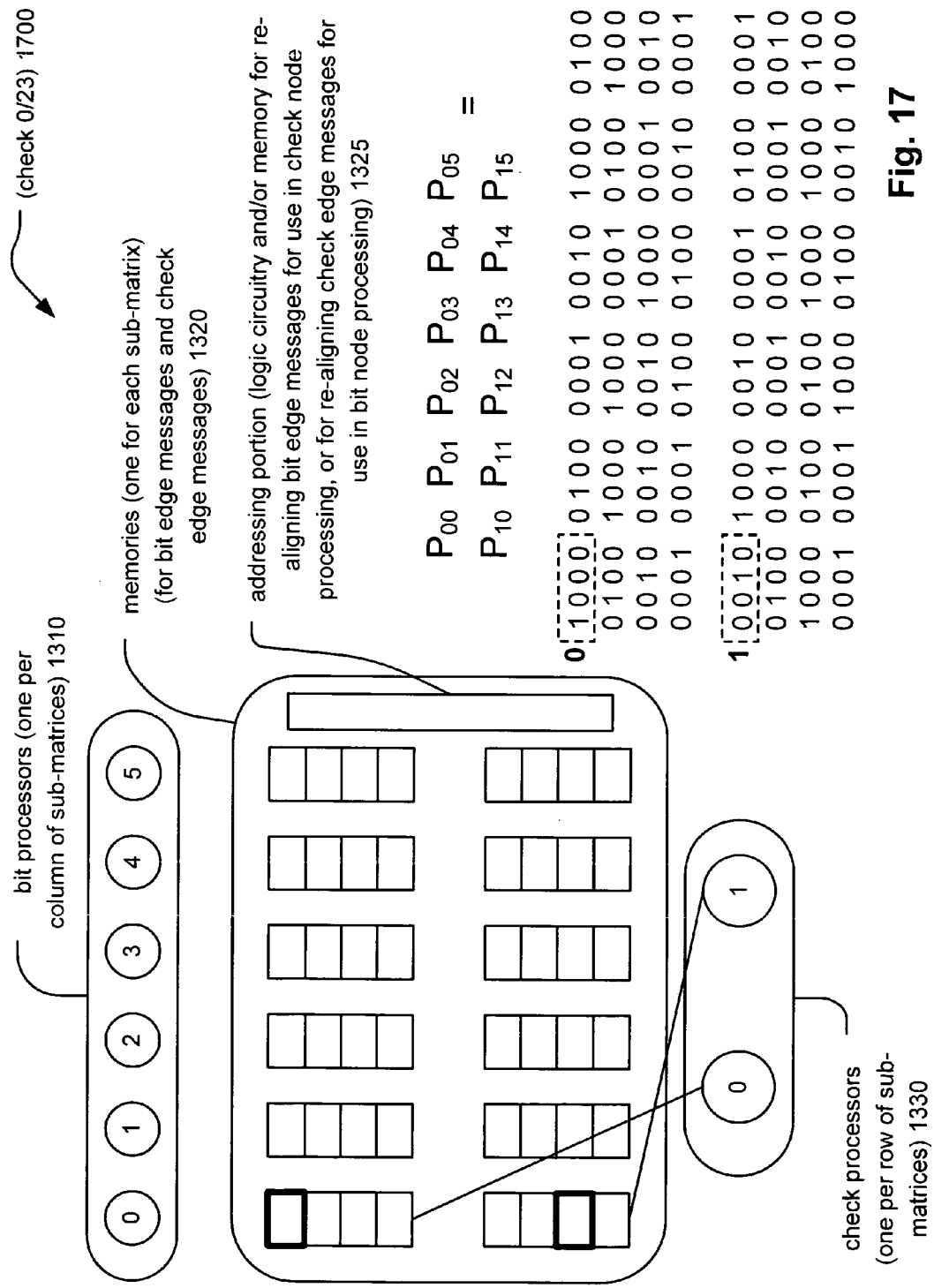
FIG. 17, FIG. 18, FIG. 19, and FIG. 20 illustrate embodiments of check node processing (0/23), (1/23), (6/23), and (7/23) when employing 24 cycles, respectively.

Referring to the embodiment 1700 of the FIG. 17 of the check node processing through the low density parity check matrix, H, during the cycle (0/23), the first or top most rows of each of the individual sub-matrices situated in the first or left hand most column of sub-matrices undergo check node processing. For example, it can be seen that the non-zero element portion of each first or top most row of each sub-matrix situated in the first or left hand most column of sub-matrices is processed and the updated edge message is stored in the appropriately addresses memory location of the corresponding memory situated in the left hand most of the memories 1320. Again, an addressing portion 1325 can be implemented in conjunction with each memory storage location of each of the memories 1320 to ensure this appropriate addressing.

Figure 18:
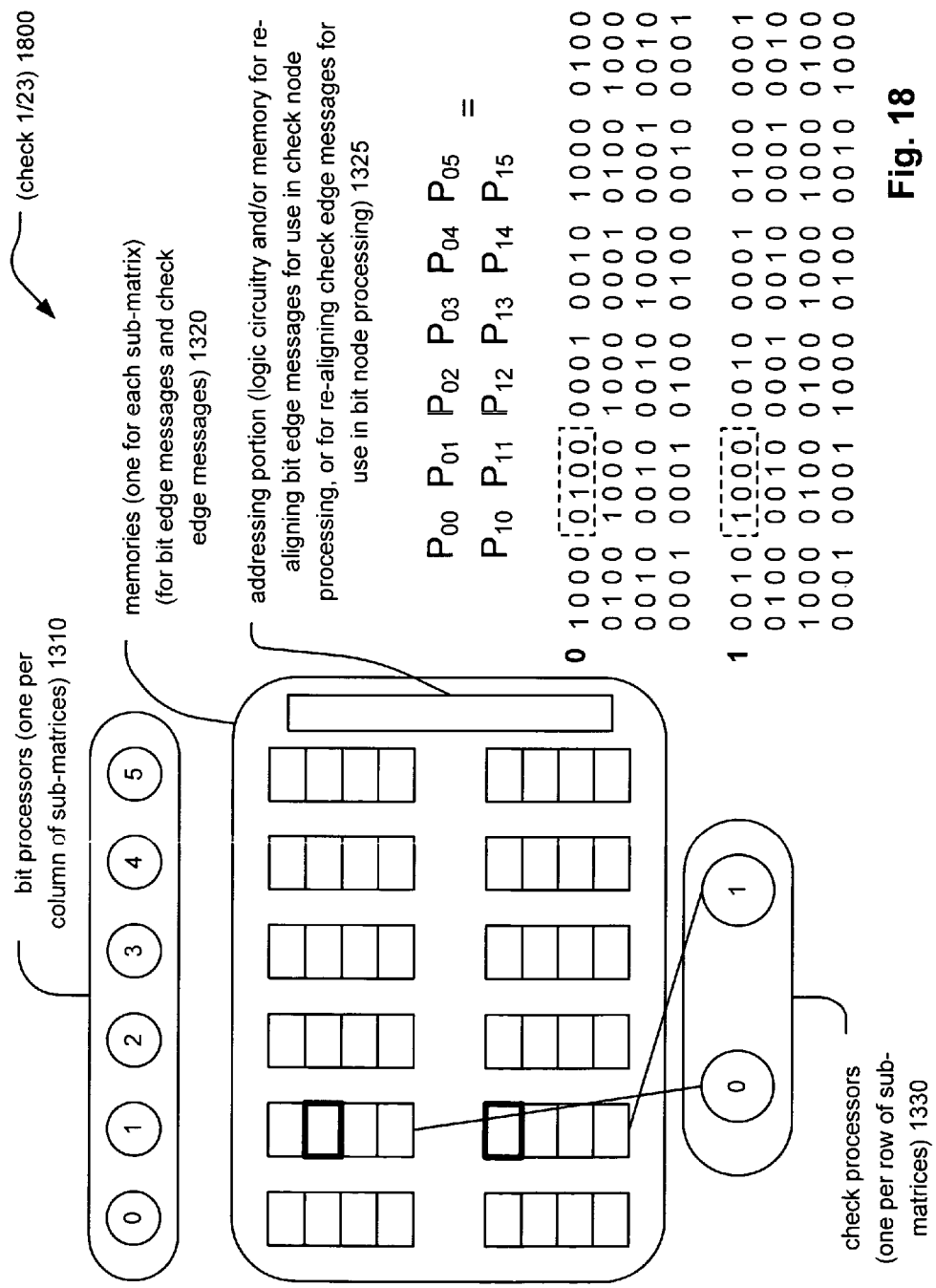

Referring to the embodiment 1800 of the FIG. 18 of the check node processing through the low density parity check matrix, H, during the cycle (1/23), the first or top most rows of each of the individual sub-matrices situated in the second or $2^{nd}$ to left hand most column of sub-matrices undergo check node processing. For example, it can be seen that the non-zero element portion of each first or top row of each sub-matrix situated in the second or $2^{nd}$ to left hand most column of sub-matrices is processed and the updated edge message is stored in the appropriately addresses memory location of the corresponding memory situated in the second or $2^{nd}$ to left hand most of the memories 1320.

The first or top most rows of each of the individual sub-matrices situated in the third or $3^{rd}$ to left hand most column of sub-matrices undergo check node processing during cycle (2/23); the first or top most rows of each of the individual sub-matrices situated in the fourth or $4^{th}$ to left hand most column of sub-matrices undergo check node processing during cycle (3/23); the first or top most rows of each of the individual sub-matrices situated in the fifth or $5^{th}$ to left hand most column of sub-matrices undergo check node processing during cycle (4/23); and the first or top most rows of each of the individual sub-matrices situated in the sixth or $6^{th}$ to left hand most column of sub-matrices undergo check node processing during cycle (5/23).

Figure 19:
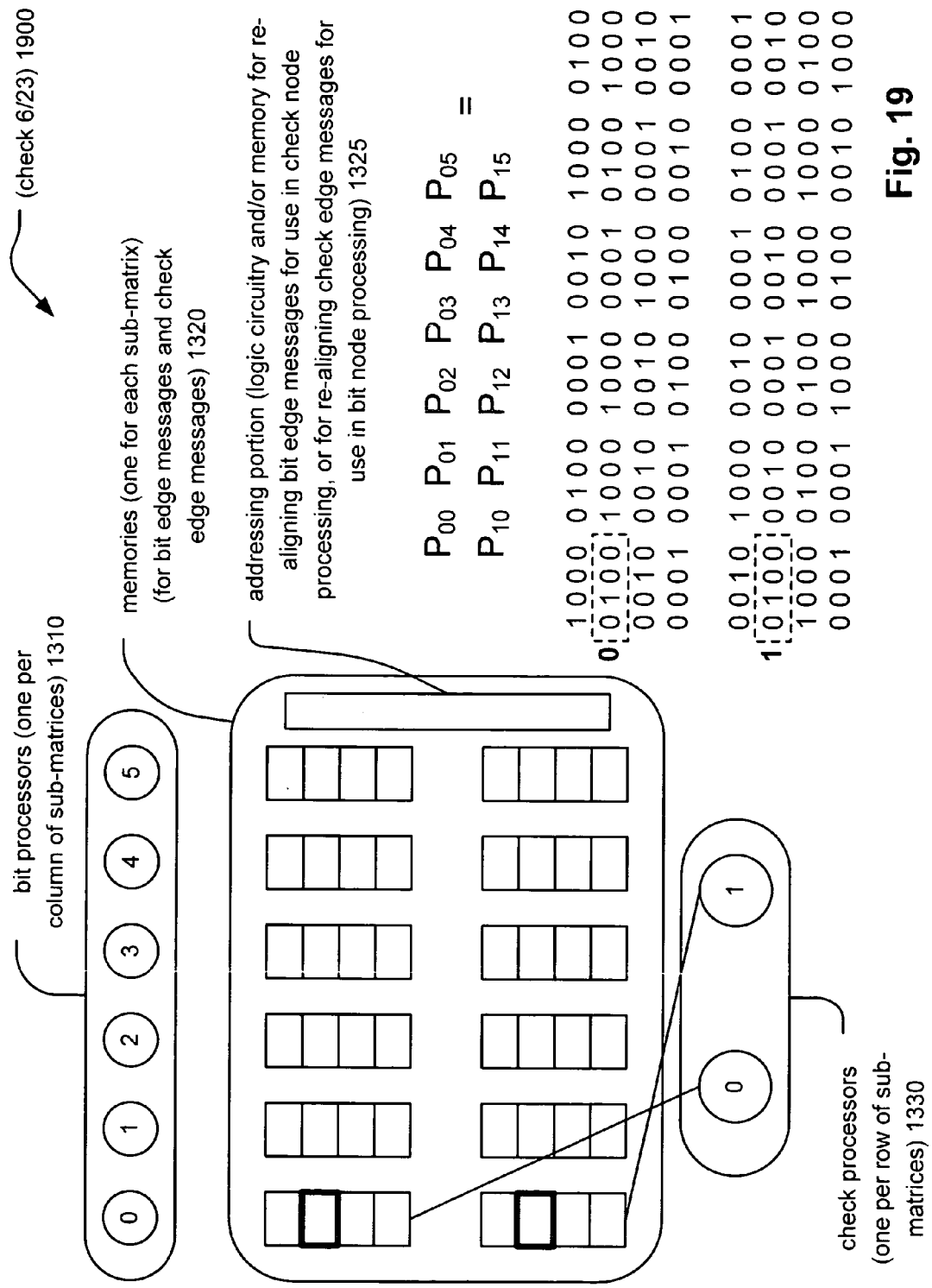

Referring to the embodiment 1900 of the FIG. 19 of the check node processing through the low density parity check matrix, H, during the cycle (6/23), the second or $2^{nd}$ to top most rows of each of the individual sub-matrices situated in the first or left hand most column of sub-matrices undergo check node processing. For example, it can be seen that the non-zero element portion of each second or $2^{nd}$ to top most row of each sub-matrix situated in the first or left hand most column of sub-matrices is processed and the updated edge message is stored in the appropriately addresses memory location of the corresponding memory situated in the left hand most of the memories 1320.

Figure 20:
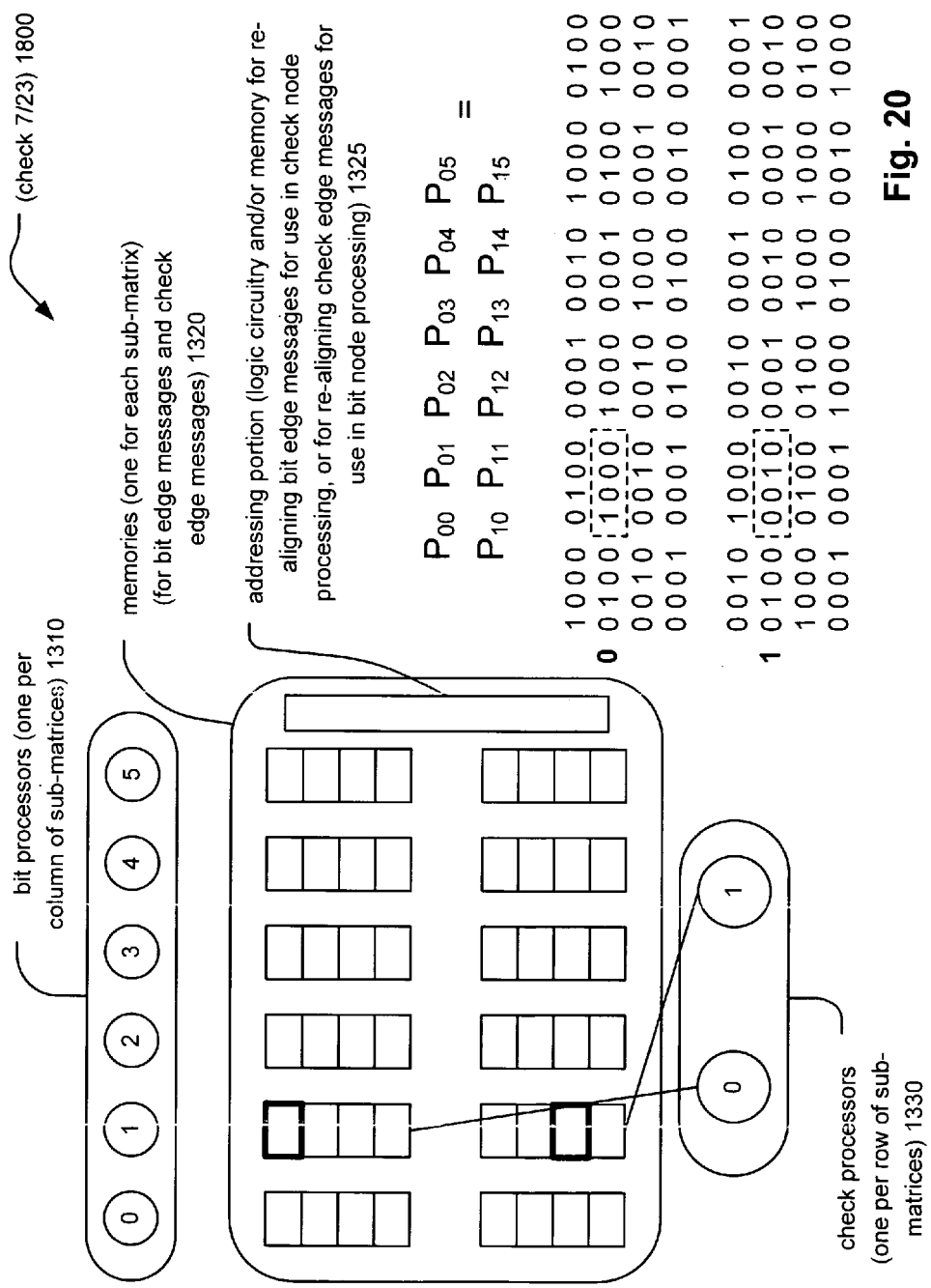

Referring to the embodiment 2000 of the FIG. 20 of the check node processing through the low density parity check matrix, H, during the cycle (7/23), the second or $2^{nd}$ to top most rows of each of the individual sub-matrices situated in the second or $2^{nd}$ to left hand most column of sub-matrices undergo check node processing. For example, it can be seen that the non-zero element portion of each second or $2^{nd}$ to top most row of each sub-matrix situated in the second or $2^{nd}$ to left hand most column of sub-matrices is processed and the updated edge message is stored in the appropriately addresses memory location of the corresponding memory situated in the second or $2^{nd}$ to hand most of the memories 1320.

The check node processing continues along this approach until each of the individual rows of the sub-matrices of the low density parity check matrix, H, have undergone check node processing according to this approach. As can be seen, it takes 24 cycles to perform this approach of check node processing.

In these embodiments described above, when each bit processor of the bit processors 1310 processes one bit edge message at a time, then the total number of bit edge messages processed per cycle is $N_s$. When each check processor of the check processors 1330 processes one check edge message at a time, then the total number of check edge messages processed per cycle is $M_s$.

Typically, the hardware is determined by the total number of edges that is processed per cycle. It is more efficient to have the number of edges being processed per cycle to vary as little as possible. Therefore, a designer can employ a design such that each of the bit processors 1310 and the check processors 1330 process different numbers of edge at a time. That is to say, the number of bit edge messages being processed by each bit processor need not be the same as the number of check edge messages being processed by each check processor at a given time. For example, each bit processor can process a first number of bit edges messages, and each check processor can process a second number of check edges messages. This way, the total number of edges being processed during each cycle can be designed to be as close as possible to being the same. In those cases where $N_s$ is divisible by $M_s$, then a designer can modify the design so that the number of check edge messages being processed per check node processing cycle is also $N_s$, which is the number of bit edge messages being processed per bit node processing cycle.

The following embodiments of check node processing provide a means by which the number of check edge messages being processed per check node processing cycle can be $N_s$, which is the number of bit edge messages being processed per bit node processing cycle. This makes for a more efficient design, in that, fewer of the processors (i.e., either bit node processors or check node processors) are left idle at any given time. In embodiments in which a check node processor and a bit node processor share at least a portion of components and/or circuitry, this can make for a much more efficient design.

Figure 21:
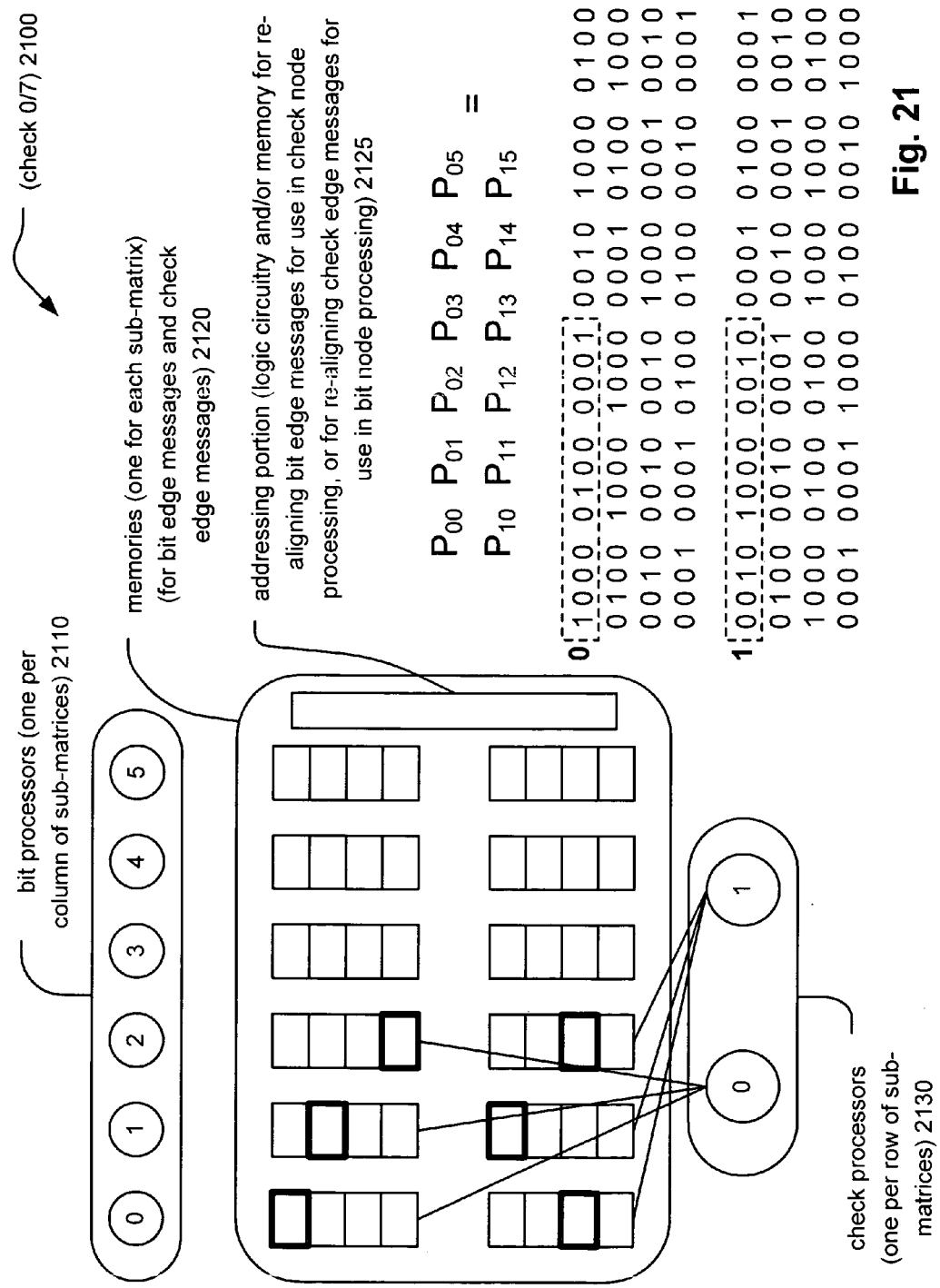
FIG. 21, FIG. 22, and FIG. 23 illustrate embodiments of check node processing (0/7), (1/7), and (2/7) when employing 8 cycles, respectively.
Figure 22:
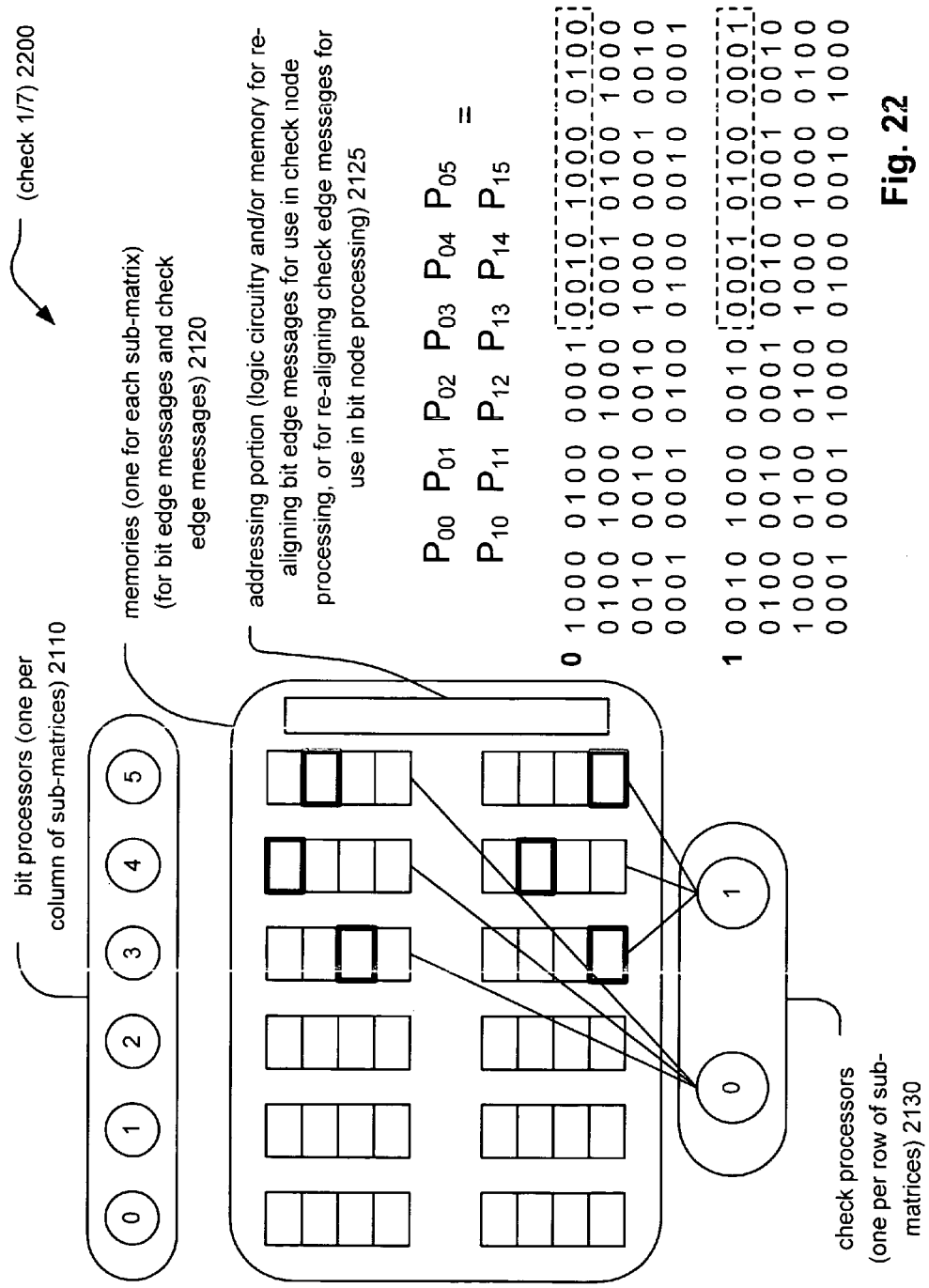
Figure 23:
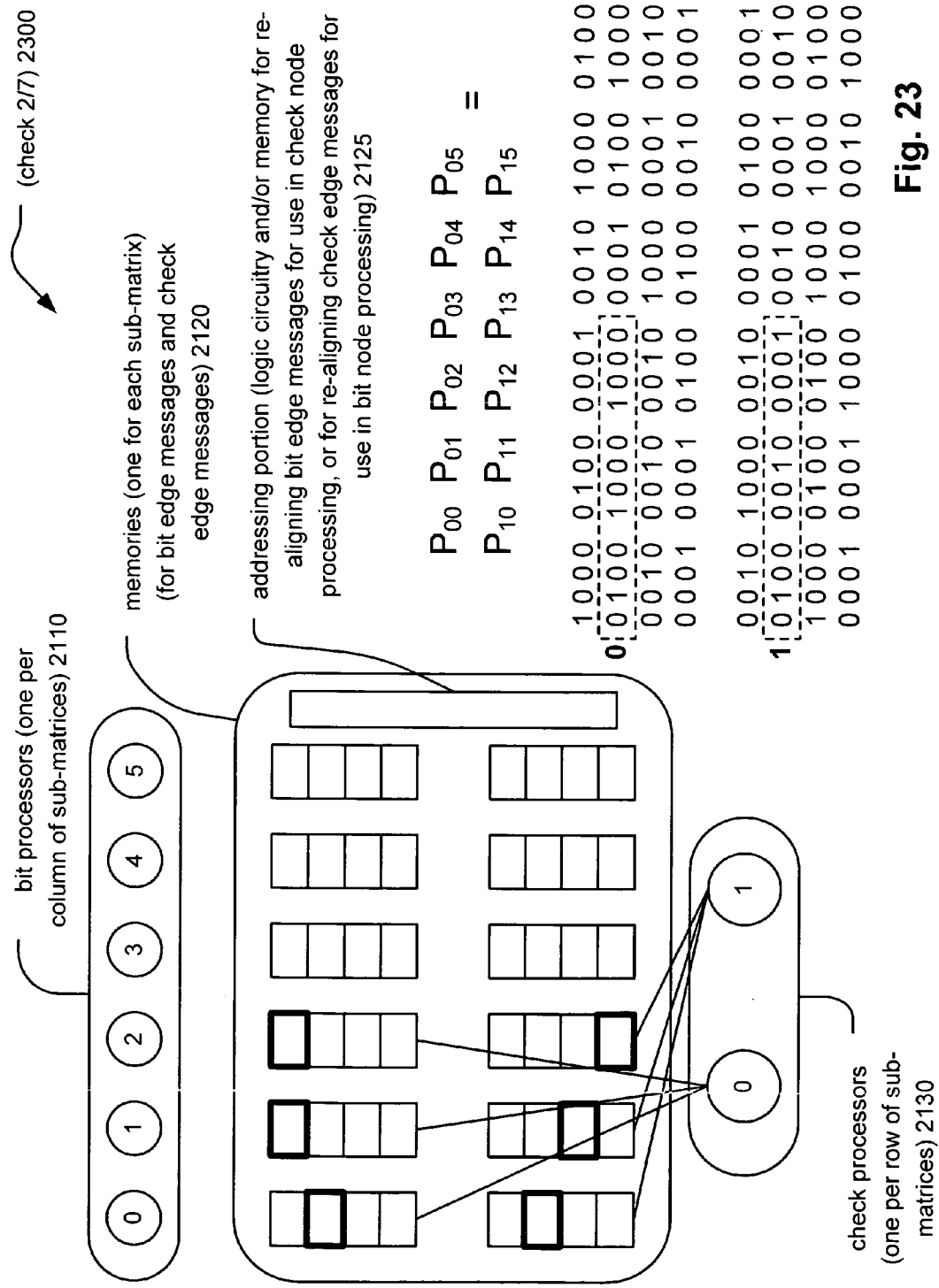

FIG. 21, FIG. 22, and FIG. 23 illustrate embodiments 2100, 2200, and 2300 of check node processing (0/7), (1/7), and (2/7) when employing 8 cycles, respectively. This check node processing approach also operates by only processing the processing the $1^{st}$ rows of each sub-matrix of a $1^{st}$ plurality of sub-matrices, then processing the $1^{st}$ rows of each sub-matrix of a $2^{nd}$ plurality of sub-matrices and so on until all of the $1^{st}$ rows of all of the sub-matrices have been processed. Then the processing continues by processing the $2^{nd}$ rows of each sub-matrix of the $1^{st}$ plurality of sub-matrices, then processing the $2^{nd}$ rows of each sub-matrix of the $2^{nd}$ plurality of sub-matrices and so on until all of the $2^{nd}$ rows of all of the sub-matrices have been processed. This processing continues until all of the sub-matrices have undergone check node processing. At least one difference between this check node processing approach and the check node processing approach of embodiments 1700, 1800, 1900, 1900, and 2000 of check node processing (0/23), (1/23), (6/23), and (7/23) is the number of sub-matrices that are processed at a time.

The total number of bit processors 2110 corresponds to the number of columns of sub-matrices of the low density parity check matrix, H, of the LDPC code. For example, this embodiment shows that there are $N_s=6$ columns of the sub-matrices, so 6 bit processors 2110 are shown. However, for a low density parity check matrix, H, having larger (or smaller) sized sub-matrices having a different number of columns, the number of bit processors 2210 could be adjusted accordingly.

These embodiments also employ a total number of check processors 2130 that corresponds to the number of rows sub-matrices of the low density parity check matrix, H, of the LDPC code. For example, this embodiment shows that the sub-matrices each include $M_s=2$ rows, so 2 check processors 2130 are shown. However, for a low density parity check matrix, H, having larger (or smaller) sized sub-matrices having a different number of rows, the number of check processors 2130 could also be adjusted accordingly (just as the number of bit processors 2110 could be adjusted, as described above).

In addition, a plurality of memories 2120 is employed to store the bit edge messages and the check edge messages when performing bit node processing and check node processing. The total number of memories 2120 employed can be selected to correspond to the number of sub-matrices into which the low density parity check matrix, H, is partitioned. For example, this embodiment shows a low density parity check matrix, H, that is composed of a plurality of permutation matrices, depicted by $P_{00}, P_{01}, P_{02}, P_{03}, P_{04}, P_{05}, P_{10}, P_{11}, P_{12}, P_{13}, P_{14}$, and $P_{15}$. The number of columns of permutation matrices of the low density parity check matrix, H, is shown as being $N_s=6$, and number of rows of permutation matrices of the low density parity check matrix, H, is shown as being $M_s=2$. Therefore, in this embodiment, the total number of memories 2120 corresponds to the total number of sub-matrices: $N_s \times M_s = 6 \times 2 = 12$.

The plurality of memories 2120 is employed store the edge messages (i.e., bit edge messages updated during bit node processing, and the check edge messages updated during check node processing).

Analogous to other embodiments described above, in each of the embodiment of FIG. 21, FIG. 22, and FIG. 23, an addressing portion 2125 is generally depicted. This can be implemented as a plurality of permuters that is capable to permute the bit edge messages (after being updated) when retrieved from the memories 2120 for use in check node processing. The addressing portion 2125 can be viewed to include at least all of the options and capabilities of the addressing portion 925 and the addressing portion 1325 described with reference to other embodiments as well.

Using this approach, $P_s \times M_s$ cycles are performed during each check node processing step, and each check processor communicates with $N_s/M_s$ memories of the memories 2220 in each cycle. Therefore, in this particular embodiment, $P_s \times M_s = 4 \times 2 = 8$ cycles are performed during each check node processing step. Each check processor is selectively capable to be communicatively coupled to $N_s$ memories, and each check processor communicatively couples with $N_s/M_s$ of the memories 2120 during any one cycle. To effectuate the appropriate communicative coupling between each check processor of the check processors 2130 and the corresponding and appropriate memory of the memories 1320, MUXes can be employed as described above with reference to another embodiment. If the MUX approach is desired, then the total number of $M_s$ to 1 MUXes required is $N_s$. The total number of edges that is processed per cycle is therefore $N_s$, which is the number of bit edge messages being processed per bit node processing cycle according to the embodiments depicted in FIG. 13, FIG. 14, FIG. 15, and FIG. 16. Again, it is noted that each memory of the memories 1320 can be implemented to generate the addresses in the appropriate permuted order to ensure proper check node processing.

Referring to the embodiment 2100 of the FIG. 21 of the check node processing through the low density parity check matrix, H, during the cycle (0/7), the first or top most rows of each of the individual sub-matrices situated in the sub-matrices of the left half side of the low density parity check matrix, H, undergo check node processing. For example, it can be seen that the non-zero element portion of each first or top most row of each sub-matrix situated in the sub-matrices of the left half side of the low density parity check matrix, H, is processed and the updated edge message is stored in the appropriately addresses memory location of the corresponding memory situated in those memories situated in the left half side of the memories 2120. Again, an addressing portion 2125 can be implemented in conjunction with each memory storage location of each of the memories 2120 to ensure this appropriate addressing.

Referring to the embodiment 2200 of the FIG. 22 of the check node processing through the low density parity check matrix, H, during the cycle (1/7), the first or top most rows of each of the individual sub-matrices situated in the sub-matrices of the right half side of the low density parity check matrix, H, undergo check node processing. For example, it can be seen that the non-zero element portion of each first or top most row of each sub-matrix situated in the sub-matrices of the right half side of the low density parity check matrix, H, is processed and the updated edge message is stored in the appropriately addresses memory location of the corresponding memory situated in those memories situated in the right half side of the memories 2120.

Referring to the embodiment 2300 of the FIG. 23 of the check node processing through the low density parity check matrix, H, during the cycle (2/7), the second or $2^{nd}$ to top most rows of each of the individual sub-matrices situated in the sub-matrices of the left half side of the low density parity check matrix, H, undergo check node processing. For example, it can be seen that the non-zero element portion of each second or $2^{nd}$ to top most row of each sub-matrix situated in the sub-matrices of the left half side of the low density parity check matrix, H, is processed and the updated edge message is stored in the appropriately addresses memory location of the corresponding memory situated in those memories situated in the left half side of the memories 2120.

The check node processing continues along this approach until each of the individual rows of the sub-matrices of the low density parity check matrix, H, have undergone check node processing according to this approach. As can be seen, it takes 8 cycles to perform this approach of check node processing.

These above described embodiments provide a means by which the number of cycles performed during both bit node processing and check node processing can be designed to be the same. This can provide for a much more efficient implementation in terms of at least ensuring that a relatively small (if even any at all) amount of hardware is left idle at any time.

With respect to the various embodiments depicted herein of sub-matrix sweeping based implementations of LDPC decoders, it is again noted that the edge messages can be stored to comport with either check order or bit order, whichever is desired. In addition, there are a variety of ways in which this can be achieved including using logic, addressing, and/or permutation means. In addition, the number of columns of sub-matrices processed per bit node processing cycle does not need to be the same as the number of rows of sub-matrices processed per check node processing cycle. The number of bit edge messages processed by each bit processor per cycle does not need to be the same as the number of check edge messages processed by each check processor per cycle. Moreover, these various embodiments can easily be adapted to a low density parity check matrix, H, having 1 or more sub-matrices that include all zero values.

Figure 24:
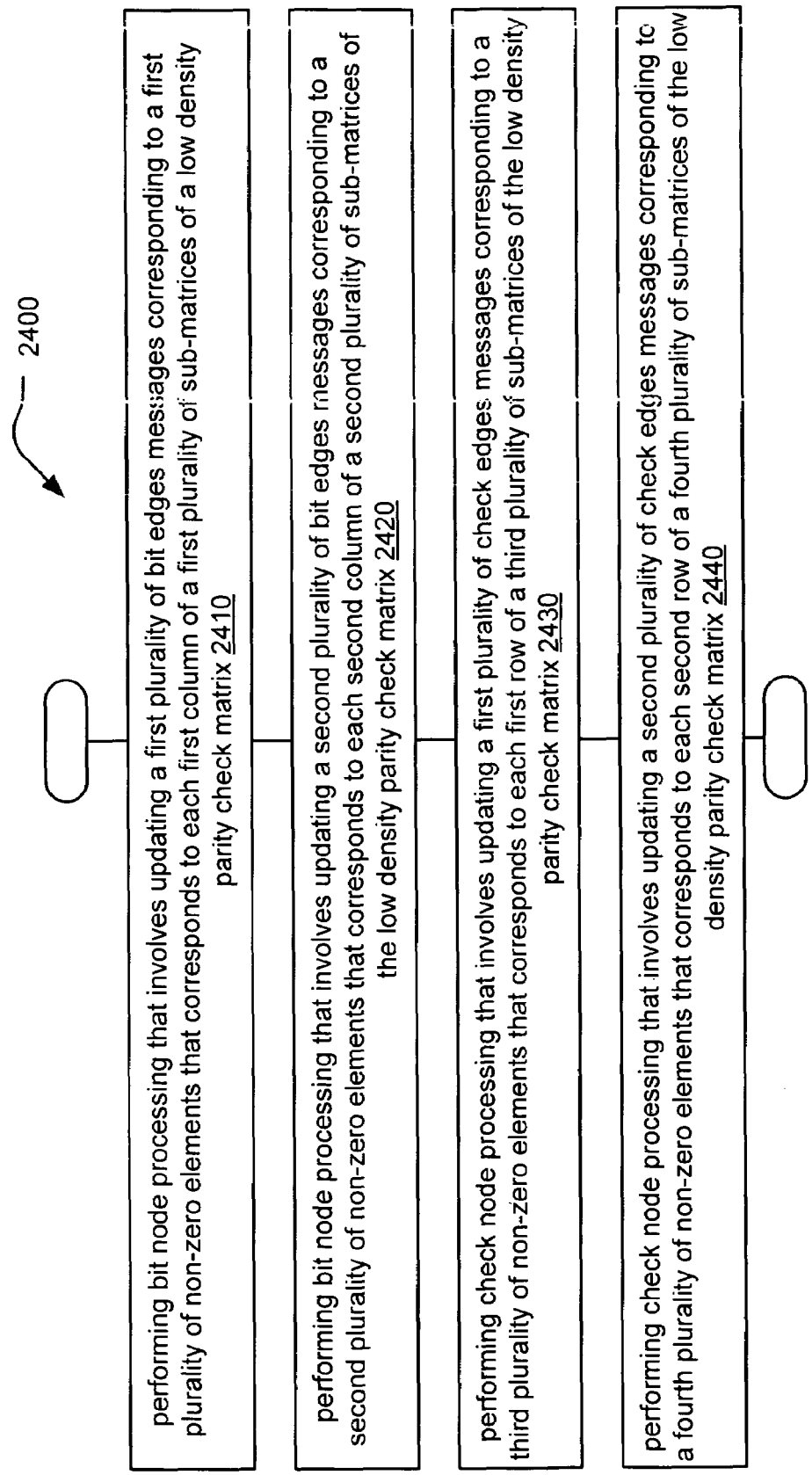
FIG. 24 illustrates an embodiment of a method for performing bit node processing and check node processing.

FIG. 24 illustrates an embodiment of a method 2400 for performing bit node processing and check node processing. The method 2400 begins by performing bit node processing that involves updating a first plurality of bit edges messages corresponding to a first plurality of non-zero elements that corresponds to each first column of a first plurality of sub-matrices of a low density parity check matrix that includes a plurality of sub-matrices. Within the low density parity check matrix, each sub-matrix includes a plurality of rows and a plurality of columns. The method 2400 continues by performing bit node processing that involves updating a second plurality of bit edges messages corresponding to a second plurality of non-zero elements that corresponds to each second column of a second plurality of sub-matrices of the low density parity check matrix. Within the blocks 2410 and 2420, the first plurality of sub-matrices and the second plurality of sub-matrices can be all of the sub-matrices of the low density parity check matrix in some embodiments. Alternatively, the first plurality of sub-matrices and the second plurality of sub-matrices can each be only selected groups of sub-matrices, respectively, of the low density parity check matrix.

As shown in a block 2430, the method 2400 continues by performing check node processing that involves updating a first plurality of check edges messages corresponding to a third plurality of non-zero elements that corresponds to each first row of a third plurality of sub-matrices of the low density parity check matrix. Then, the method 2400 continues by performing check node processing that involves updating a second plurality of check edges messages corresponding to a fourth plurality of non-zero elements that corresponds to each second row of a fourth plurality of sub-matrices of the low density parity check matrix.

Within the blocks 2430 and 2440, the third plurality of sub-matrices and the fourth plurality of sub-matrices can be all of the sub-matrices of the low density parity check matrix in some embodiments. Alternatively, the third plurality of sub-matrices and the fourth plurality of sub-matrices can each be only selected groups of sub-matrices, respectively, of the low density parity check matrix.

Clearly, it is noted that there may be embodiments where more than 2 bit node processing steps, and more than 2 check node processing steps, may be performed without departing from the scope and spirit of the invention. This embodiment illustrates the generally processing that can be extended up to 2 or more bit node processing steps, and 2 or more check node processing steps, to accommodate any low density parity check matrix, H, having any size that is partitioned into any desired number of sub-matrices.

It is noted that the first plurality of bit edges messages, the second plurality of bit edges messages, the first plurality of check edges messages, and the second plurality of check edges messages correspond to the selective connectivity via a plurality of edges between a plurality of bit nodes and a plurality of check nodes of an LDPC (Low Density Parity Check) bipartite graph that corresponds to an LDPC code.

In certain embodiments, the method 2400 can also include arranging each bit edge message of the updated first plurality of bit edge messages so that, when subsequently employed for use in check node processing that involves updating the first plurality of check edges messages, the updated first plurality of bit edge messages is arranged according to the selective connectivity via the plurality of edges between the plurality of bit nodes and the plurality of check nodes of the LDPC bipartite graph that corresponds to the LDPC code. Alternatively, the method 2400 can include arranging each check edge message of the updated first plurality of check edge messages so that, when subsequently employed for use in subsequent bit node processing that involves updating a third plurality of bit edges messages, the updated first plurality of check edge messages is arranged according to the selective connectivity via the plurality of edges between the plurality of bit nodes and the plurality of check nodes of the LDPC bipartite graph that corresponds to the LDPC code.

It is also noted that the methods described within the preceding figures may also be performed within any appropriate system and/or apparatus designs (e.g., communication systems, communication devices, communication transmitters, communication receivers, communication transceivers, and/or functionality described) without departing from the scope and spirit of the invention.

In view of the above detailed description of the invention and associated drawings, other modifications and variations will now become apparent. It should also be apparent that such other modifications and variations may be effected without departing from the spirit and scope of the invention.

What is claimed is:

1. An apparatus, comprising:
a plurality of bit node processors that is operable to:
during a first time, perform bit node processing that involves updating a first plurality of bit edges messages corresponding to a first plurality of non-zero elements that corresponds to each first column of each sub-matrix of a low density parity check matrix that includes a plurality of sub-matrices, each sub-matrix of the plurality of sub-matrices includes a plurality of rows and a plurality of columns; and
during a second time, perform bit node processing that involves updating a second plurality of bit edges messages corresponding to a second plurality of non-zero elements that corresponds to each second column of each sub-matrix of the low density parity check matrix; and
a plurality of check node processors that is operable to:
during a third time, perform check node processing that involves updating a first plurality of check edges messages corresponding to a third plurality of non-zero elements that corresponds to each first row of each sub-matrix of the low density parity check matrix; and
during a fourth time, perform check node processing that involves updating a second plurality of check edges messages corresponding to a fourth plurality of non-zero elements that corresponds to each second row of each sub-matrix of the low density parity check matrix; and
wherein the first plurality of bit edges messages, the second plurality of bit edges messages, the first plurality of check edges messages, and the second plurality of check edges messages correspond to the selective connectivity via a plurality of edges between a plurality of bit nodes and a plurality of check nodes of an LDPC (Low Density Parity Check) bipartite graph that corresponds to an LDPC code.

2. The apparatus of claim 1, wherein:
at least one non-zero element is included within the first plurality of non-zero elements and the third plurality of non-zero elements.

3. The apparatus of claim 1, further comprising:
a plurality of memories; and wherein:
N is an integer;
M is an integer;
each row of the low density parity check matrix includes N sub-matrices;
each column of the low density parity check matrix includes M sub-matrices;
during the first time, each bit node processor of the plurality of bit node processors communicates with M memories of the plurality of memories such that N×M bit edge messages are updated; and
during the third time, each check node processor of the plurality of check node processors communicates with N memories of the plurality of memories such that N×M check edge messages are updated.

4. The apparatus of claim 1, further comprising:
a plurality of memories; and wherein:
the first time includes a fifth time and a sixth time;
N is an integer;
each row of the low density parity check matrix includes N sub-matrices;
during the fifth time, each bit node processor of the plurality of bit node processors communicates with one memory of the plurality of memories such that a first N bit edge messages are updated; and
during the sixth time, each bit node processor of the plurality of bit node processors communicates with one memory of the plurality of memories such that a second N bit edge messages are updated.

5. The apparatus of claim 1, further comprising:
a plurality of memories; and wherein:
the third time includes a fifth time and a sixth time;
M is an integer;
each column of the low density parity check matrix includes M sub-matrices;
during the fifth time, each check node processor of the plurality of check node processors communicates with one memory of the plurality of memories such that a first M check edge messages are updated; and
during the sixth time, each check node processor of the plurality of check node processors communicates with one memory of the plurality of memories such that a second M check edge messages are updated.

6. The apparatus of claim 1, wherein:
N is an integer;
M is an integer;
each row of the low density parity check matrix includes N sub-matrices;
each column of the low density parity check matrix includes M sub-matrices;
the first time includes a fifth time and a sixth time;
the first plurality of bit edges messages includes a third plurality of bit edges messages and a fourth plurality of bit edges messages;
the first plurality of non-zero elements includes a fifth plurality of non-zero elements and a sixth plurality of non-zero elements; and
the plurality of bit node processors is operable to:
during the fifth time, perform bit node processing that involves updating the third plurality of bit edges messages corresponding to the fifth plurality of non-zero elements that corresponds to each first column of a first 1/M of the sub-matrices of the plurality of sub-matrices such that a first N bit edge messages are updated; and
during the sixth time, perform bit node processing that involves updating the fourth plurality of bit edges messages corresponding to the sixth plurality of non-zero elements that corresponds to each first column of a second 1/M of the sub-matrices of the plurality of sub-matrices such that a second N bit edge messages are updated.

7. The apparatus of claim 1, wherein:
N is an integer;
M is an integer;
each row of the low density parity check matrix includes N sub-matrices;
each column of the low density parity check matrix includes M sub-matrices;
the third time includes a fifth time and a sixth time;
the first plurality of check edges messages includes a third plurality of check edges messages and a fourth plurality of check edges messages;
the third plurality of non-zero elements includes a fifth plurality of non-zero elements and a sixth plurality of non-zero elements; and
the plurality of check node processors is operable to:
during the fifth time, perform check node processing that involves updating the third plurality of check edges messages corresponding to the fifth plurality of non-zero elements that corresponds to each first row of a first 1/N of the sub-matrices of the plurality of sub-matrices such that a second M check edge messages are updated; and
during the sixth time, perform check node processing that involves updating the fourth plurality of check edges messages corresponding to the sixth plurality of non-zero elements that corresponds to each first row of a second 1/N of the sub-matrices of the plurality of sub-matrices such that a second M check edge messages are updated.

8. The apparatus of claim 1, wherein:
N is an integer;
M is an integer;
each row of the low density parity check matrix includes N sub-matrices;
each column of the low density parity check matrix includes M sub-matrices;
the third time includes a fifth time and a sixth time;
the first plurality of check edges messages includes a third plurality of check edges messages and a fourth plurality of check edges messages;
the third plurality of non-zero elements includes a fifth plurality of non-zero elements and a sixth plurality of non-zero elements; and
the plurality of check node processors is operable to:
during the fifth time, perform check node processing that involves updating the third plurality of check edges messages corresponding to the fifth plurality of non-zero elements that corresponds to each first row of a first ½ of the sub-matrices of the plurality of sub-matrices, corresponding to the left hand side of the low density parity check matrix, such that a first N check edge messages are updated; and
during the sixth time, perform check node processing that involves updating the fourth plurality of check edges messages corresponding to the sixth plurality of non-zero elements that corresponds to each first row of a second ½ of the sub-matrices of the plurality of sub-matrices, corresponding to the right hand side of the low density parity check matrix, such that a second N check edge messages are updated.

9. The apparatus of claim 1, further comprising:
a plurality of memories; and wherein:
each memory of the plurality of memories is operable to store a bit edge message of the updated first plurality of bit edge messages; and
each memory of the plurality of memories includes a memory portion that is operable to store an address corresponding to each bit edge message of the updated first plurality of bit edge messages so that, when subsequently retrieved for use in check node processing that involves updating the first plurality of check edges messages, the updated first plurality of bit edge messages is arranged according to the selective connectivity via the plurality of edges between the plurality of bit nodes and the plurality of check nodes of the LDPC bipartite graph that corresponds to the LDPC code.

10. The apparatus of claim 1, further comprising:
a plurality of memories; and wherein:
each memory of the plurality of memories is operable to store a check edge message of the updated first plurality of check edge messages; and
each memory of the plurality of memories includes a memory portion that is operable to store an address corresponding to each check edge message of the updated first plurality of check edge messages so that, when subsequently retrieved for use in subsequent bit node processing that involves updating a third plurality of bit edges messages, the updated first plurality of check edge messages is arranged according to the selective connectivity via the plurality of edges between the plurality of bit nodes and the plurality of check nodes of the LDPC bipartite graph that corresponds to the LDPC code.

11. The apparatus of claim 1, wherein:
a bit node processor of the plurality of bit node processors employs a first processing circuitry and a second processing circuitry; and
a check node processor of the plurality of check node processors employs the first processing circuitry and a third processing circuitry.

12. The apparatus of claim 1, wherein:
when updating a bit edge message of the first plurality of bit edge messages, a bit node processor of the plurality of bit node processors performs a first calculation and a second calculation; and
when updating a check edge message of the first plurality of check edge messages, a check node processor of the plurality of check node processors performs the first calculation and a third calculation.

13. The apparatus of claim 1, wherein:
the LDPC code is a regular LDPC code or an irregular LDPC code; and
the apparatus is a decoder that is operable to perform error correction decoding of an LDPC coded signal to generate a best estimate of an information bit that has been encoded into the LDPC coded signal.

14. An apparatus, comprising:
a plurality of bit node processors that is operable to:
during a first time, perform bit node processing that involves updating a first plurality of bit edges messages corresponding to a first plurality of non-zero elements that corresponds to a first column of each sub-matrix of a first plurality of sub-matrices of a low density parity check matrix that includes a plurality of sub-matrices; and
during a second time, perform bit node processing that involves updating a second plurality of bit edges messages corresponding to a second plurality of non-zero elements that corresponds to a second column of each sub-matrix of a second plurality of sub-matrices of the low density parity check matrix; and
a plurality of check node processors that is operable to:
during a third time, perform check node processing that involves updating a first plurality of check edges messages corresponding to a third plurality of non-zero elements that corresponds to a first row of each sub-matrix of a third plurality of sub-matrices of the low density parity check matrix; and
during a fourth time, perform check node processing that involves updating a second plurality of check edges messages corresponding to a fourth plurality of non-zero elements that corresponds to a second row of each sub-matrix of a third plurality of sub-matrices of the low density parity check matrix; and
wherein the first plurality of bit edges messages, the second plurality of bit edges messages, the first plurality of check edges messages, and the second plurality of check edges messages correspond to the selective connectivity via a plurality of edges between a plurality of bit nodes and a plurality of check nodes of an LDPC (Low Density Parity Check) bipartite graph that corresponds to an LDPC code.

15. The apparatus of claim 14, wherein:
at least one non-zero element is included within the first plurality of non-zero elements and the third plurality of non-zero elements; and
at least one sub-matrix of the first plurality of sub-matrices is included within the third plurality of sub-matrices.

16. The apparatus of claim 14, wherein:
a first row of the low density parity check matrix includes the first plurality of sub-matrices;
a second row of the low density parity check matrix includes the second plurality of sub-matrices;
a first column of the low density parity check matrix includes the third plurality of sub-matrices; and
a second column of the low density parity check matrix includes the fourth plurality of sub-matrices.

17. The apparatus of claim 14, wherein:
the first column of each sub-matrix of the first plurality of sub-matrices and the second column of each sub-matrix of the second plurality of sub-matrices correspond to a left hand most column of each sub-matrix of the first plurality of sub-matrices and each sub-matrix of the second plurality of sub-matrices.

18. A method, comprising:
during a first time, performing bit node processing that involves updating a first plurality of bit edges messages corresponding to a first plurality of non-zero elements that corresponds to each first column of a first plurality of sub-matrices of a low density parity check matrix that includes a plurality of sub-matrices, each sub-matrix of the plurality of sub-matrices includes a plurality of rows and a plurality of columns;
during a second time, performing bit node processing that involves updating a second plurality of bit edges messages corresponding to a second plurality of non-zero elements that corresponds to each second column of a second plurality of sub-matrices of the low density parity check matrix;
during a third time, performing check node processing that involves updating a first plurality of check edges messages corresponding to a third plurality of non-zero elements that corresponds to each first row of a third plurality of sub-matrices of the low density parity check matrix; and
during a fourth time, performing check node processing that involves updating a second plurality of check edges messages corresponding to a fourth plurality of non-zero elements that corresponds to each second row of a fourth plurality of sub-matrices of the low density parity check matrix, wherein the first plurality of bit edges messages, the second plurality of bit edges messages, the first plurality of check edges messages, and the second plurality of check edges messages correspond to the selective connectivity via a plurality of edges between a plurality of bit nodes and a plurality of check nodes of an LDPC (Low Density Parity Check) bipartite graph that corresponds to an LDPC code.

19. The method of claim 18, further comprising:
arranging each bit edge message of the updated first plurality of bit edge messages so that, when subsequently employed for use in check node processing that involves updating the first plurality of check edges messages, the updated first plurality of bit edge messages is arranged according to the selective connectivity via the plurality of edges between the plurality of bit nodes and the plurality of check nodes of the LDPC bipartite graph that corresponds to the LDPC code.

20. The method of claim 18, further comprising:
arranging each check edge message of the updated first plurality of check edge messages so that, when subsequently employed for use in subsequent bit node processing that involves updating a third plurality of bit edges messages, the updated first plurality of check edge messages is arranged according to the selective connectivity via the plurality of edges between the plurality of bit nodes and the plurality of check nodes of the LDPC bipartite graph that corresponds to the LDPC code.

* * * * *